US011489056B2

(12) United States Patent
Cheng et al.

(10) Patent No.: US 11,489,056 B2
(45) Date of Patent: Nov. 1, 2022

(54) SEMICONDUCTOR DEVICE WITH MULTI-THRESHOLD GATE STRUCTURE

(71) Applicant: Taiwan Semiconductor Manufacturing Co., Ltd., Hsinchu (TW)

(72) Inventors: Chung-Liang Cheng, Changhua County (TW); Peng-Soon Lim, Johor (MY); Ziwei Fang, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/785,919

(22) Filed: Feb. 10, 2020

(65) Prior Publication Data
US 2021/0249517 A1    Aug. 12, 2021

(51) Int. Cl.
*H01L 29/423*    (2006.01)
*H01L 21/28*    (2006.01)
(Continued)

(52) U.S. Cl.
CPC .. *H01L 29/42392* (2013.01); *H01L 21/28061* (2013.01); *H01L 21/28088* (2013.01); *H01L 21/823821* (2013.01); *H01L 21/823842* (2013.01); *H01L 27/0924* (2013.01); *H01L 29/0649* (2013.01); *H01L 29/0673* (2013.01);
(Continued)

(58) Field of Classification Search
CPC ..... H01L 21/823431; H01L 21/823821; H01L 21/28088; H01L 21/28061; H01L 21/823842; H01L 21/82345; H01L 29/66795; H01L 29/785–7851; H01L 29/42392; H01L 29/0673; H01L 29/78696; H01L 29/66439; H01L 29/775;
(Continued)

(56) References Cited

U.S. PATENT DOCUMENTS

| | | | | |
|---|---|---|---|---|
| 10,074,574 B2* | 9/2018 | Bao | ............... | H01L 21/823821 |
| 10,872,825 B2* | 12/2020 | Chiang | ............... | H01L 29/0649 |
| 2014/0004692 A1* | 1/2014 | Wei | ............... | H01L 21/823821 |
| | | | | 438/589 |
| 2014/0246732 A1* | 9/2014 | Chen | ............... | H01L 21/823857 |
| | | | | 438/587 |

(Continued)

FOREIGN PATENT DOCUMENTS

| CN | 108122851 A | * | 6/2018 | ..... H01L 21/823821 |
|---|---|---|---|---|
| CN | 110391285 A | * | 10/2019 | |
| TW | 202006947 A | | 2/2020 | |

*Primary Examiner* — Errol V Fernandes
*Assistant Examiner* — Jeremy J Joy
(74) *Attorney, Agent, or Firm* — Sterne, Kessler, Goldstein & Fox P.L.L.C.

(57) ABSTRACT

The present disclosure describes a semiconductor device that includes a substrate and a first transistor on the substrate. The first transistor includes a first gate structure and the first gate structure includes a gate dielectric layer and a first work function layer on the gate dielectric layer. The first gate structure also includes a capping layer on the first work function layer. The semiconductor device also includes a second transistor on the substrate, in which the second transistor includes a second gate structure. The second gate structure includes the gate dielectric layer and a second work function layer on the gate dielectric layer. The second gate structure also includes the first work function layer on the second work function layer and the silicon capping layer on the first work function layer.

20 Claims, 27 Drawing Sheets

(51) Int. Cl.
*H01L 21/8238* (2006.01)
*H01L 29/06* (2006.01)
*H01L 29/49* (2006.01)
*H01L 29/66* (2006.01)
*H01L 27/092* (2006.01)
*B82Y 10/00* (2011.01)

(52) U.S. Cl.
CPC .... *H01L 29/4966* (2013.01); *H01L 29/66439* (2013.01); *B82Y 10/00* (2013.01)

(58) Field of Classification Search
CPC ............. H01L 29/4966; H01L 27/0886; H01L 27/1211; H01L 27/0924
See application file for complete search history.

(56) References Cited

U.S. PATENT DOCUMENTS

| | | | |
|---|---|---|---|
| 2014/0363960 A1* | 12/2014 | Kim | H01L 21/28176 438/585 |
| 2016/0181107 A1* | 6/2016 | Shin | H01L 21/28088 438/592 |
| 2016/0336194 A1* | 11/2016 | Yeh | H01L 29/66545 |
| 2016/0365347 A1* | 12/2016 | Bao | H01L 21/32139 |
| 2017/0330956 A1* | 11/2017 | Lin | H01L 21/823842 |
| 2018/0138178 A1* | 5/2018 | Lin | H01L 27/092 |
| 2019/0131185 A1* | 5/2019 | Huang | H01L 29/4966 |
| 2019/0157165 A1* | 5/2019 | Kim | H01L 21/321 |
| 2019/0198498 A1* | 6/2019 | Park | H01L 29/42364 |
| 2020/0013897 A1* | 1/2020 | Park | H01L 21/82345 |
| 2021/0013111 A1* | 1/2021 | Smith | H01L 21/823821 |

* cited by examiner

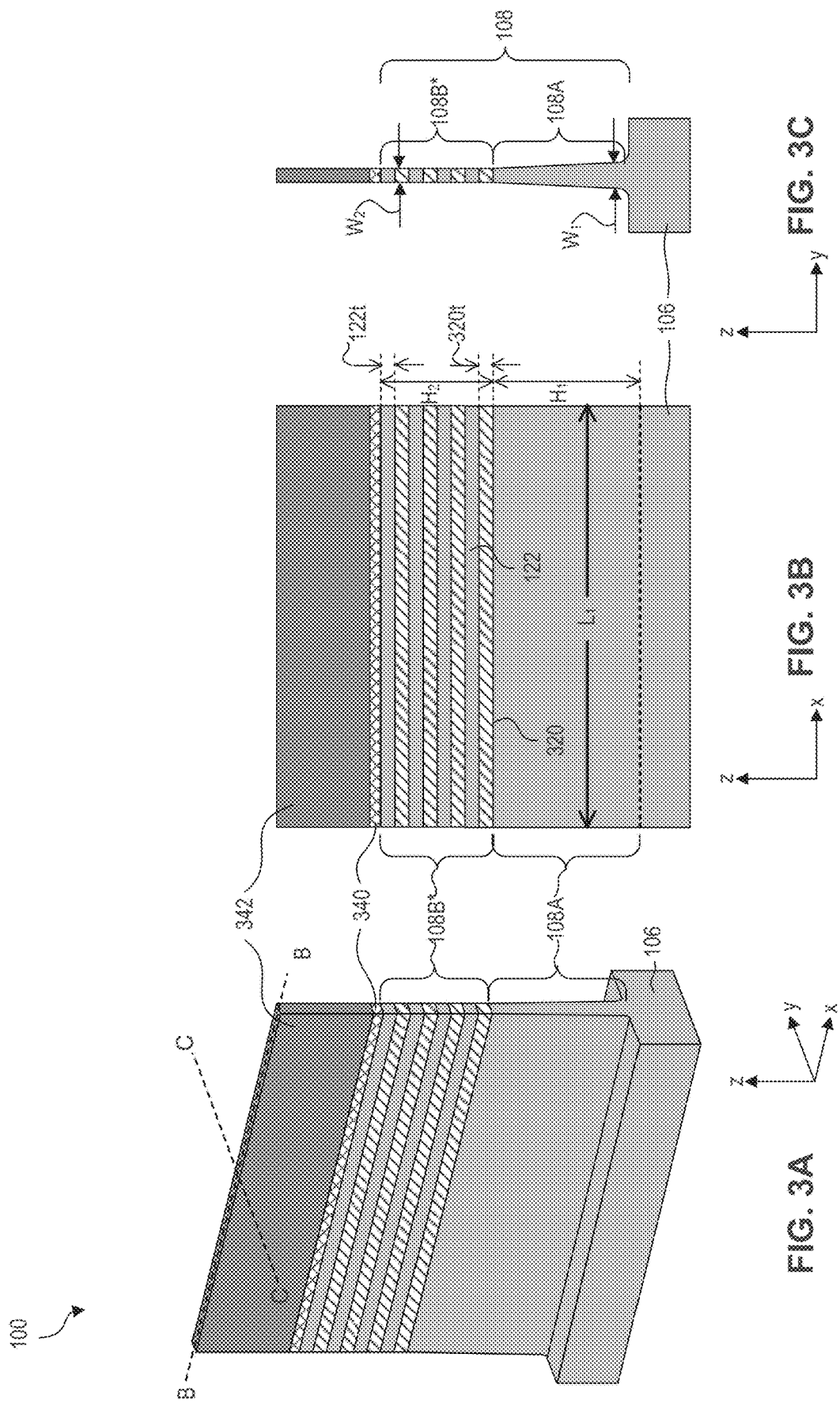

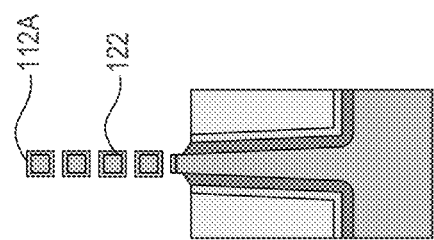
FIG. 9C
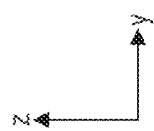
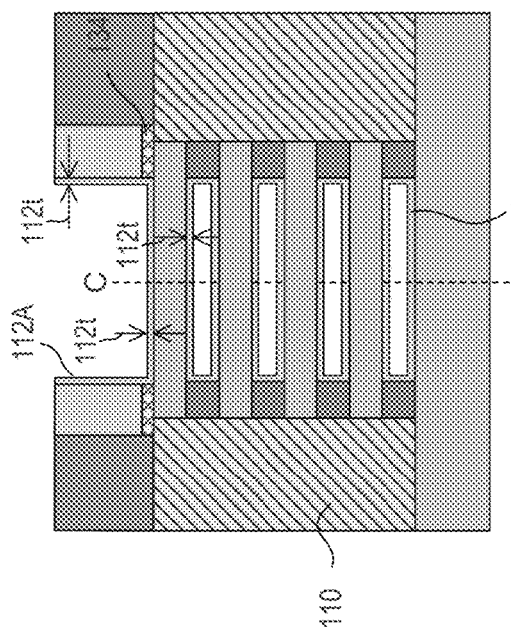
FIG. 9B
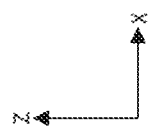

SEMICONDUCTOR DEVICE WITH MULTI-THRESHOLD GATE STRUCTURE

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased power consumption and parasitic capacitance in semiconductor devices.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 3A-3C, 4A-4C, 5A-5D, 6A-6D, 7A-7C, 8A-8C, and 9A-9C illustrate various views of semiconductor devices having multi-threshold voltages at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
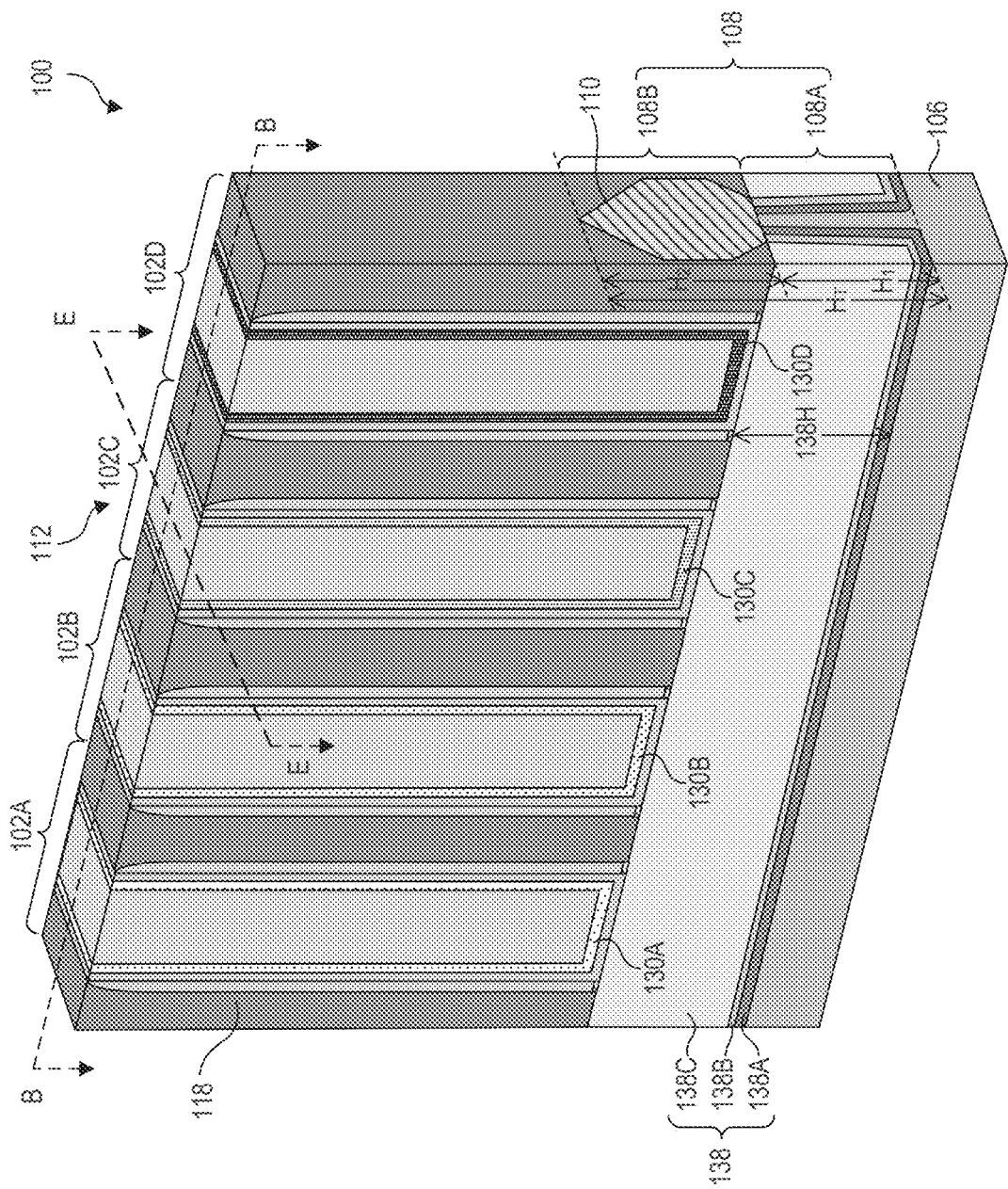
FIGS. 1A and 1B-1D illustrate an isometric view and cross-sectional views of semiconductor devices, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "high-k" refers to a high dielectric constant. In the field of semiconductor device structures and manufacturing processes, high-k refers to a dielectric constant that is greater than the dielectric constant of SiO2 (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value).

The present disclosure provides example multi-threshold voltage field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

Multi-threshold voltage integrated circuit (IC) devices are often utilized in the semiconductor IC industry to optimize delay or power. A multi-threshold voltage IC device can include several different devices, each having a different threshold voltage (e.g., operating voltage). For example, a multi-threshold voltage IC device can include one or more low threshold voltage devices and one or more high threshold voltage devices. Approaches to achieving different threshold voltages across the semiconductor devices include work function layer thickness variation and ion implantation modulation. However, as technology nodes continue to decrease, functional density (e.g., the number of interconnected devices per chip area) has generally increased while geometry size (e.g., the smallest component (or line) that can be created using a fabrication process) has decreased. In a gate-all-around FET (GAA FET) for example, increasing work function layer thicknesses to accommodate different threshold voltages consumes valuable IC device space, limiting the amount of devices that can be fabricated on a single chip. On the other hand, varying ion implantation in a GAA FET to achieve different threshold voltages is also challenging and can result in non-conformity due to, for example, ion implantation shadow effects.

Various embodiments in the present disclosure describe methods for forming multi-threshold voltage devices. The embodiments described herein use GAA FETs as examples, and can be applied to other semiconductor structures, such as finFETs and planar FETs. Various embodiments herein describe multi-deposition and patterning process to form multi-layer metal work function materials as work function layers in different device regions. For example, a plurality of devices having different compositions of work function layers can be formed on a substrate, thus forming semiconductor devices with multi-threshold voltages. In some embodiments, work function layers formed of silicon incorporated titanium nitride (TiSiN) with various silicon atomic concentrations can also provide as an aluminum diffusion layer. In some embodiments, multi-threshold voltage devices can be formed by implementing nitrogen incorporated work function layers formed by various ammonia thermal annealing treatments. For example, the nitrogen incorporated work function layers can be formed of titanium aluminum carbon nitride (TiAlCN). A bi-layer hardmask can also be used to provide sufficient etch selectivity against different etchants during the fabrication process. In addition, the multi-layer layer work function materials can also decrease gate resistance.

Figure 1B:
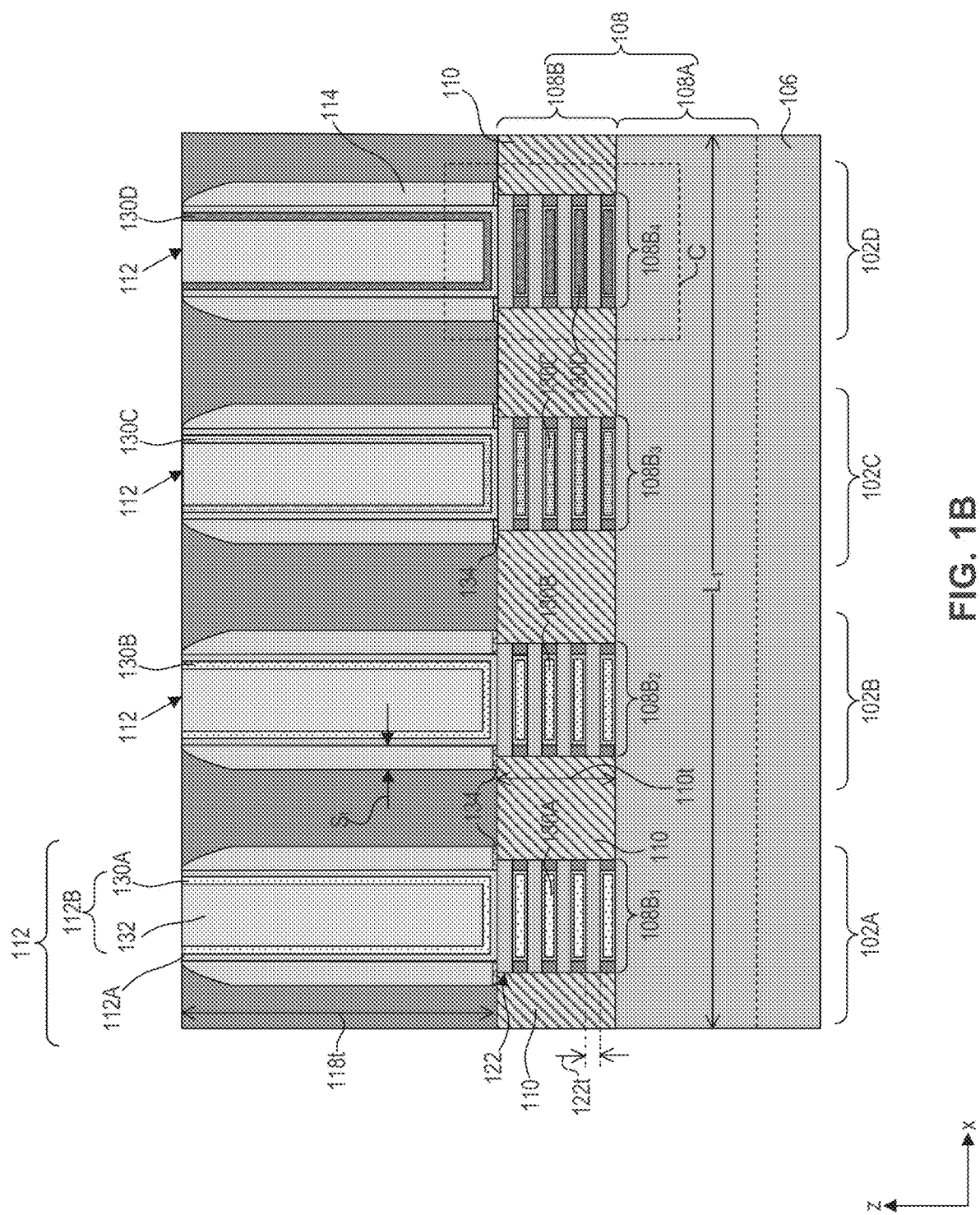
Figure 1D:
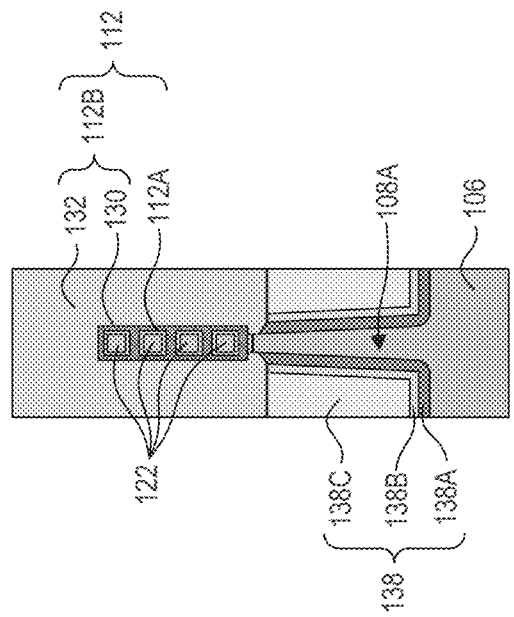
Figure 1C:
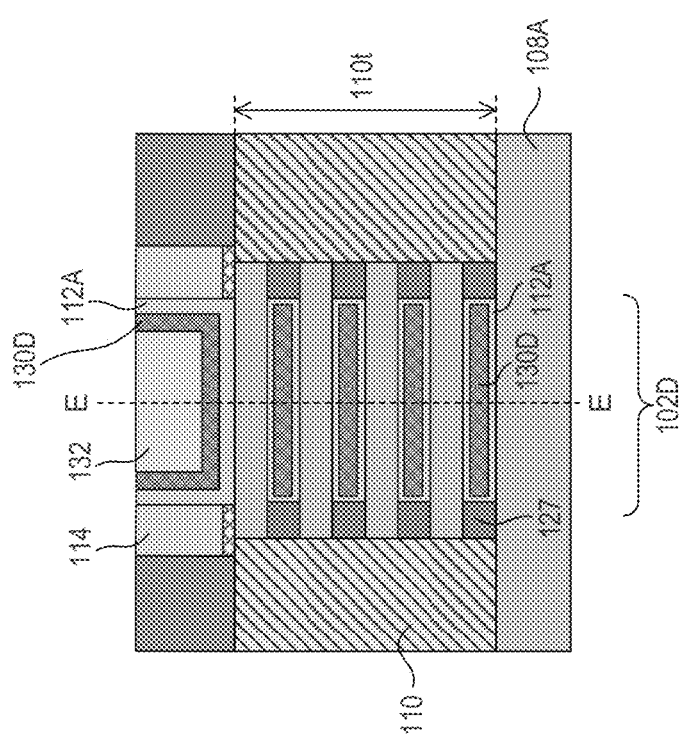

A semiconductor device 100 having finFETs 102A-102D is described with reference to FIGS. 1A-1D, according to some embodiments. FIG. 1A illustrates an isometric view of semiconductor device 100, according to some embodiments. FIG. 1B illustrates a cross-sectional view along line B-B of semiconductor device 100 of FIG. 1A. FIG. 1C illustrates a zoomed-in area C of the cross-sectional view of FIG. 1B. FIG. 1D illustrates a cross-sectional view along line E-E of semiconductor device 100 in FIG. 1A.

In some embodiments, finFETs 102A-102D can be both p-type finFETs (PFETs) or n-type finFETs (NFETs) or one of each conductivity type finFETs. For example, finFETs 102A and 102B can be NFETs and finFETs 102C and 102D can be PFETs. FinFETs 102A through 102D can have different threshold voltages by incorporating different work function metal layers. In some embodiments, finFET 102A can be an n-type low threshold voltage device, finFET 102B and be an n-type high threshold voltage device, finFET 102C can be a p-type high threshold voltage device, finFET 102D can be a p-type low threshold voltage device. Though four finFETs are shown in FIGS. 1A-1B, semiconductor device 100 can have any number of finFETs. The discussion of elements of finFETs 102A-102D with the same annotations applies to each other, unless mentioned otherwise. The isometric and cross-sectional views of semiconductor device 100 are shown for illustration purposes and may not be drawn to scale.

Referring to FIGS. 1A-1B, finFETs 102A-102D can be formed on a substrate 106. Substrate 106 can be a semiconductor material such as, but not limited to, silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Semiconductor device 100 can further include a fin structure 108 extending along an x axis and through finFETs 102A-102D. Fin structure 108 can include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include stacked fin portions $108B_1$, $108B_2$, $108B_3$, and $108B_4$ and epitaxial regions 110. Each of stacked fin portions $108B_1$, $108B_2$, $108B_3$, and $108B_4$ can include a stack of semiconductor layers 122, which can be in the form of nanowires. Each semiconductor layer 122 can form a channel region underlying gate structures 112 of finFETs 102A-102D.

In some embodiments, semiconductor layers 122 can include semiconductor materials similar to or different from substrate 106. In some embodiments, each of semiconductor layer 122 can include silicon germanium (SiGe) with Ge in a range from about 25 atomic percent to about 50 atomic percent (e.g., about 30 atomic percent, 35 atomic percent, or about 45 atomic percent) with any remaining atomic percent being Si or can include Si without any substantial amount of Ge.

The semiconductor materials of semiconductor layers 122 can be undoped or can be in-situ doped during their epitaxial growth process using. (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. Semiconductor layers 122 can have respective vertical dimensions $122t$ (e.g., thicknesses) along a z-axis, each ranging from about 6 nm to about 10 nm (e.g., about 7 nm, about 8 nm, or about 9.5 nm). Other dimensions and materials for semiconductor layers 122 are within the scope and spirit of this disclosure. Though four layers of semiconductor layers 122 are shown in FIGS. 1A-1B, semiconductor device 100 can have any number of semiconductor layers 122.

Referring to FIGS. 1A-1B, epitaxial fin regions 110 can be grown on regions of base fin portion 108A that do not underlie gate structures 112. In some embodiments, epitaxial fin regions 110 can have any geometric shape, for example, polygonal or circular. Epitaxial fin regions 110 can include an epitaxially-grown semiconductor material. In some embodiments, the epitaxially grown semiconductor material is the same material as the material of substrate 106. In some embodiments, the epitaxially-grown semiconductor material includes a different material from the material of substrate 106. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

Referring to FIG. 1C, in some embodiments, epitaxial fin regions 110 can each have a height 110t. In some embodiments, epitaxial fin height 110t can be equal to or different from vertical dimension $H_2$ of fin top portion 108B. In some embodiments, epitaxial fin height 110t can range from about 10 nm to about 100 nm (e.g., about 30 nm, about 50 nm, about 70 nm, or about 80 nm). Other dimensions for epitaxial fin regions 110 are within the scope and spirit of this disclosure.

In some embodiments, epitaxial fin regions 110 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. Such repeated deposition/partial etch process is also called a cyclic deposition-etch (CDE) process.

Epitaxial fin regions 110 can be n-type for NFETs 102A-102B and p-type for PFETs 102C-102D. In some embodiments, epitaxial fin regions 110 of finFETs 102A, 102B, 102C, and 102D can be the same or opposite doping type with respect to each other. P-type epitaxial fin regions 110 can include SiGe and can be in-situ doped during an epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type epitaxial fin regions 110 can include Si and may be in-situ doped during an epitaxial growth process using n-type dopants, such as phosphorus or arsenic. For n-type in-situ doping, n-type doping precursors such as, but not limited to, phosphine ($PH_3$), arsine ($AsH_3$), and/or other n-type doping precursor can be used.

Referring to FIG. 1B, epitaxial fin regions 110 can form source/drain (S/D) regions of finFETs 102A-102D. Each of the channel regions in semiconductor layers 122 of stacked fin portions $108B_1$ through $108B_4$ can be interposed between a pair of S/D regions. Though finFETs 102A-102D are shown to have fin structure 108 with stacked fin portions $108B_1$ through $108B_4$ on fin base portion 108A, other fin structures (e.g., a single layered fin structure etched from or epitaxially grown on substrate 106) of finFETs 102A through 102D are within the scope and spirit of this disclosure.

In some embodiments, fin base portion 108A and fin top portion 108B can have respective vertical dimensions $H_1$ and $H_2$ (e.g., heights) along a z-axis, each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm (e.g., about 85 nm, about 90 nm, about 100 nm, or about 115 nm). In some embodiments, fin structure 108 can have a horizontal dimension $L_1$ (e.g., length) along an x-axis ranging from about 100 nm to about 1 μm (e.g., about 200 nm, about 300 nm, about 500 nm, about 750 nm, or about 900 nm). Horizontal dimension $L_1$ of fin structure 108 can be at least 100 nm to prevent the relaxation of strain in fin structure 108, and consequently, prevent the relaxation of strain in channel regions formed in semiconductor layers 122 under gate structures 112. Other dimensions and materials for fin structure 108 are within the scope and spirit of this disclosure.

In some embodiments, finFETs 102A-102D can further include gate structures 112 and spacers 114. Referring to FIGS. 1A-1D, gate structures 112 can be multi-layered structures and can be wrapped around stacked fin portions $108B_1$ through $108B_4$. In some embodiments, each of semiconductor layers 122 of stacked fin portions $108B_1$ through $108B_4$ can be wrapped around by one of gate structures 112 or one or more layers of one of gate structures 112 for which gate structures 112 can be also referred to as "gate-all-around (GAA) structures" or "horizontal gate-all-around structures" and finFETs 102A-102D can be also referred to as "GAA FETs" or "GAA finFETs."

Each gate structure 112 can include a gate dielectric layer 112A disposed on semiconductor layers 122 and a gate electrode 112B disposed on gate dielectric layer 112A. As shown in FIG. 1D, gate dielectric layer 112A can be wrapped around each semiconductor layer 122, and thus electrically isolate semiconductor layers 122 from each other and from conductive gate electrode 112B to prevent shorting between gate structures 112 and S/D regions during operation of finFETs 102A-102D. In some embodiments, gate dielectric layer 112A can include (i) a layer of silicon oxide, silicon nitride, and/or silicon oxynitride formed by CVD, atomic layer deposition (ALD), physical vapor deposition (PVD), e-beam evaporation, or other suitable processes, (ii) a high-k dielectric material, such as $HfO_2$, titanium oxide ($TiO_2$), tantalum oxide ($Ta_2O_3$), $HfSiO_4$, zirconium oxide ($ZrO_2$), zirconium silicate ($ZrSiO_2$), (iii) a high-k dielectric material having oxides of lithium (Li), beryllium (Be), magnesium (Mg), Ca, Sr, Sc, Y, Zr, Al, La, Ce, praseodymium (Pr), neodymium (Nd), samarium (Sm), europium (Eu), Gd, terbium (Tb), Dy, holmium (Ho), Er, thulium (Tm), ytterbium (Yb), or lutetium (Lu), or (v) a combination thereof. High-k dielectric layers can be formed by ALD and/or other suitable methods.

FIG. 1D illustrates a cross-sectional view of PFET 102D. In some embodiments, PFET 102D can includes a gate electrode 112B that includes a gate barrier layer (not shown), a gate work function layer 130D, and a gate metal fill layer 132. As shown in FIG. 1D, each of semiconductor layers 122 can be wrapped around by gate barrier layers and gate work function layers 130D. Depending on the spaces between adjacent semiconductor layers 122 and the thicknesses of the layers of gate structures 112, semiconductor layers 122 can be wrapped around by one or more layers of gate electrodes 112B filling the spaces between adjacent semiconductor layers 122. Although FIG. 1D shows gate metal fill layers 132 partially wrapped around semiconductor layers 122, gate metal fill layers 132 can also wrap around semiconductor layers 122 to fill the spaces between adjacent semiconductor layers 122 (not shown), according to some embodiments.

In some embodiments, gate barrier layers can serve as nucleation layers for subsequent formation of gate work function layers 130A-130D and/or can help to prevent substantial diffusion of metals (e.g., Al) from gate work function layers 130A-130D to underlying layers (e.g., gate dielectric layer 112A or oxide layers). Each gate barrier layer can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layers can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, each gate barrier layer can have a thickness ranging from about 1 nm to about 10 nm. Other materials, formation methods and thicknesses for gate barrier layers are within the scope and spirit of this disclosure.

Each gate work function layer 130A-130D can include a single work function layer or a stack of work function layers. Multi-threshold voltages can be achieved by configuring work function layers of finFETs 102A-102D such that threshold voltages can be different between devices. In some embodiments, work function layer 130A of NFET 102A can include a titanium aluminum carbide layer, a silicon capping layer, and a titanium nitride layer. In some embodiments, work function layer 130B of NFET 102B can include a first titanium nitride layer, a titanium aluminum carbide layer, a silicon capping layer, and a second titanium nitride layer. In some embodiments, work function layer 130C of PFET 102C can include a tantalum nitride layer, a titanium aluminum carbide layer, a silicon capping layer, and a titanium nitride layer. In some embodiments, work function layer 130D of PFET 102D can include a tungsten carbide nitride layer, a titanium aluminum carbide layer, a silicon capping layer, and a titanium nitride layer. The variations in work function layer composition provides work function layers having work function values that are different from each other. The formation of work function layers 130A-130D are described further in detail with reference to FIGS. 11A-11E.

In some embodiments, each gate work function layer of gate work function layers 130A-130D can include any suitable material. In some embodiments, the stack of work function layers can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAN), tungsten nitride (WN), metal alloys, and/or combinations thereof. In some embodiments, each gate work function layer 130A-130D can include Al-doped metal, such as Al-doped Ti, Al-doped TiN, Al-doped Ta, or Al-doped TaN. Gate work function layers 130A-130D can be formed using a suitable process such as ALD, CVD, PVD, plating, or combinations thereof. In some embodiments, each gate work function layer 130A-130D can have a thickness ranging from about 2 nm to about 15 nm (e.g., about 2 nm, about 3 nm, about 5 nm, about 10 nm, or about 15 nm). Other materials, formation methods and thicknesses for gate work function layers 130A-130D are within the scope and spirit of this disclosure.

Each gate metal fill layer 132 can include a single metal layer or a stack of metal layers. The stack of metal layers can include metals different from each other. In some embodiments, each gate metal fill layer 132 can include a suitable conductive material, such as Ti, silver (Ag), Al, titanium aluminum nitride (TiAN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layers 132 can be formed by ALD, PVD, CVD, or other suitable deposition processes. Other materials and formation methods for gate metal fill layers 132 are within the scope and spirit of this disclosure. Though gate structures 112 of finFETs 102A-102D are shown to be similar, finFETs 102A-102D can have gate structures with materials and/or electrical properties (e.g., threshold voltage, work function value) different from each other. Also, though gate structures 112 are shown to have horizontal GAA structures, other gate structures (e.g., vertical GAA structures or gate structures without GAA structures) are within the scope and spirit of this disclosure.

Referring to FIGS. 1A-1C, spacers 114 can form sidewalls of gate structures 112 and be in physical contact with portions of gate dielectric layers 112A, according to some embodiments. Spacers 114 can include insulating material, such as silicon oxide, silicon nitride, a low-k material, or a combination thereof. Spacer 114 can include a single layer or a stack of insulating layers. Spacers 114 can have a low-k material with a dielectric constant less than about 3.9 (e.g., about 3.5, about 3.0, or about 2.8). In some embodiments, spacers 114 can include a material composed of silicon, oxygen, carbon, and/or nitrogen. The concentrations of silicon, oxygen, carbon, and nitrogen in the material for spacers 114 can depend on the desired dielectric constant for spacers 114. Varying concentrations of silicon, oxygen, carbon, and nitrogen in the material can vary the desired dielectric constant of spacers 114. In some embodiments, each spacer 114 can include a layer of silicon oxycarbonitride (SiOCN), a layer of silicon carbon nitride (SiCN), a layer of silicon oxide carbide (SiOC), or a combination thereof. In some embodiments, each spacer 114 can include a stack of a SiOCN layer disposed on a SiOC layer, which is disposed on a SiOCN layer. In some embodiments, each spacer 114 can have a thickness Sr ranging from about 5 nm to about 12 nm (e.g., about 5 nm, about 6 nm, about 8 nm, about 10 nm, or about 12 nm). Other materials and dimensions for spacers 114 are within the scope and spirit of this disclosure.

FIGS. 1C-1D are cross-sectional views of PFET 120D. As shown in FIG. 1C, inner spacer structures 127 can be formed between epitaxial fin regions 110 and work function layers 130D. Inner spacer structures 127 can reduce the parasitic capacitance of finFETs 102-102D. Each inner spacer structure 127 can have a low-k material with a dielectric constant less than about 3.9 (e.g., about 3.5, about 3.0, or about 2.8) or a high-k material with a dielectric constant ranging from about 4 to about 7. In some embodiments, inner spacer structures 127 can include a single layer or a stack of dielectric layers. In some embodiments, inner spacer structures 127 can include suitable dielectric material composed of silicon, oxygen, carbon, and/or nitrogen. The concentrations of silicon, oxygen, carbon, and nitrogen in the dielectric material for inner spacer structures 127 can depend on the desired dielectric constant. Varying concentrations of silicon, oxygen, carbon, and nitrogen in inner spacer structures 127 can vary its desired dielectric constant. Inner spacer structures 127 can be formed using SiOC, SiCN, SiOCN, SiN, silicon oxide ($SiO_x$), silicon oxynitride ($SiO_yN$) and/or a combination thereof, deposited by ALD, flowable CVD (FCVD), or other suitable methods.

Referring to FIGS. 1A-1D, semiconductor device 100 can further include an etch stop layer (ESL) (not shown), an interlayer dielectric (ILD) layer 118, and shallow trench isolation (STI) regions 138. The ESL can protect gate structures 112 and/or epitaxial fin regions 110. This protection can be provided, for example, during formation of ILD layer 118 and/or S/D contact structures (not shown in FIGS. 1A-1D). The ESL can be disposed on sidewalls of spacers 114. In some embodiments, the ESL can include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, the ESL can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, the ESL can have a thickness ranging from about 3 nm to about 30 nm. Other materials, formation methods, and thicknesses for ESL are within the scope and spirit of this disclosure.

ILD layer 118 can be disposed on ESL and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. In some embodiments, ILD layer 118 can have a thickness $118t$ in a range from about 50 nm to about 200 nm. Other materials, thicknesses, and formation methods for ILD layer 118 are within the scope and spirit of this disclosure.

STI regions 138 can provide electrical isolation between finFETs 102A-102D with fin structure 108 and neighboring finFETs with different fin structures (not shown) on substrate 106 and/or neighboring active and passive elements (not shown) integrated with or deposited on substrate 106. In some embodiments, STI regions 138 can include first and second protective liners 138A-138B and an insulating layer 138C disposed on second protective liner 138B. First and second protective liners 138A-138B can include materials different from each other. Each of first and second protective liners 138A-138B can include an oxide or nitride material. In some embodiments, first protective liner 138A can include a nitride material and second protective liner 138B can include an oxide material and can prevent oxidation of the sidewalls of fin top portion 108B during the formation of insulating layer 138C. In some embodiments, insulating layer 138C can include silicon oxide, silicon nitride, silicon oxynitride, fluorine-doped silicate glass (FSG), a low-k dielectric material, and/or other suitable insulating materials. In some embodiments, first and second protective liners 138A-138B each can have a thickness ranging from about 1 nm to about 2 nm. In some embodiments, STI regions 138 can have a vertical dimension $138_H$ (e.g., height) along a z-axis ranging from about 40 nm to about 60 nm (e.g., about 45 nm, about 50 nm, or about 55 nm). In some embodiments, vertical dimension $138_H$ can be half of the total height $H_T$ of fin structure 108.

The cross-sectional shapes of semiconductor device 100 and its elements (e.g., fin structure 108, gate structures 112, epitaxial fin regions 110, spacers 114, inner spacer structures 127, and/or STI regions 138) are illustrative and are not intended to be limiting.

Figure 2:
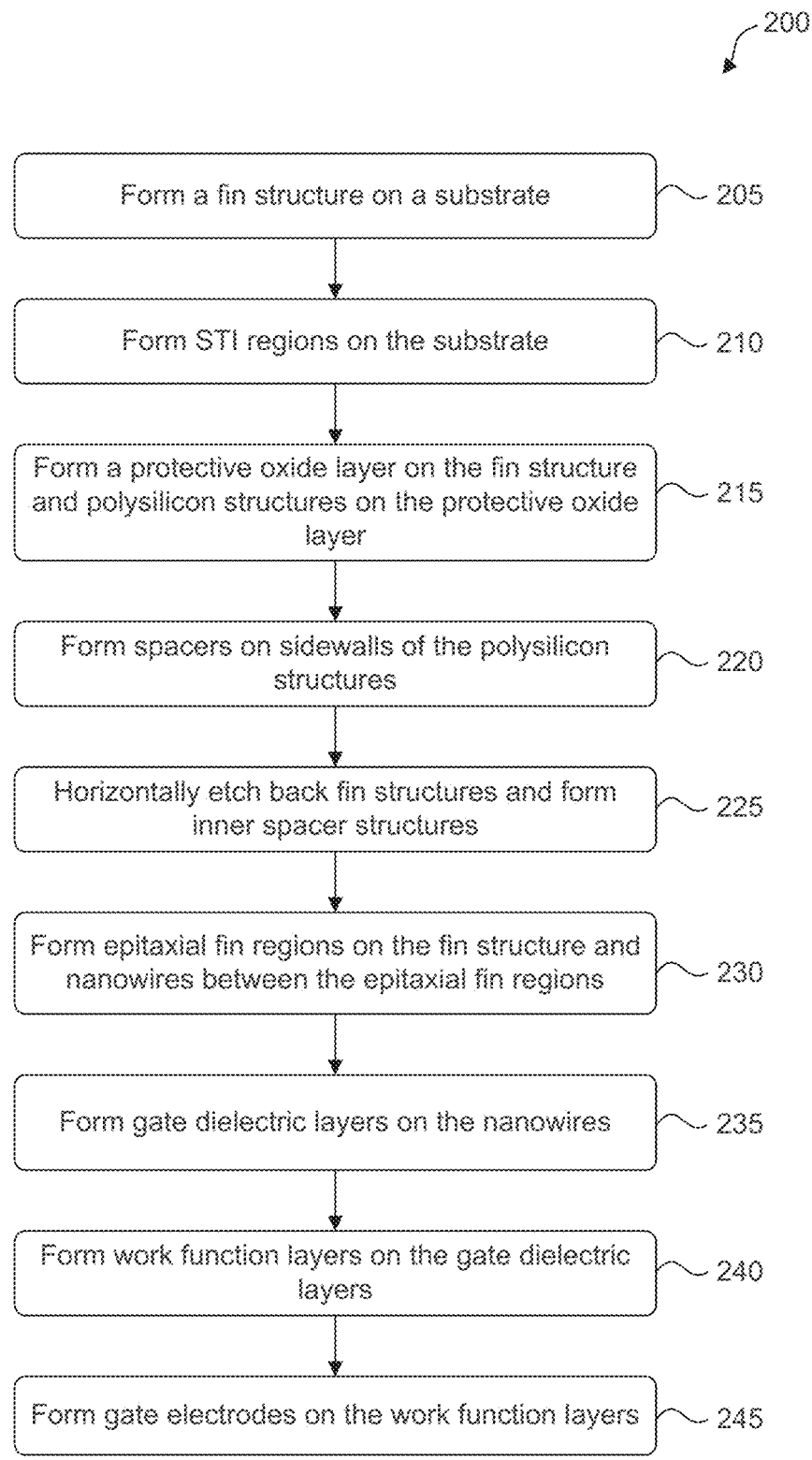
FIG. 2 is a flow diagram of a method for fabricating multi-threshold voltage semiconductor devices, in accordance with some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-12B. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Similar elements in FIGS. 3A-12B and FIGS. 1A-1D are labelled with the same annotations for simplicity.

Referring to FIG. 2, in operation 205, a fin structure is formed on a substrate, according to some embodiments. For example, fin structure 108 with fin base portion 108A and fin top portion 108B can be formed on substrate 106 as described with reference to FIGS. 3A-3C. The formation of fin structure 108 can include the formation of fin base portion 108A and fin top portion 108B* on substrate 106 as shown in FIGS. 3A-3C. Subsequent processing of fin top portion 108B*, described below, can form fin top portion 108B as described with reference to FIGS. 1A-1E.

Fin top portion 108B* can include first and second semiconductor layers 320 and 122 stacked in an alternating configuration. Each of first and second semiconductor layers 320 and 122 can be epitaxially grown on its underlying layer and can include semiconductor materials different from each other. In some embodiments, first and second semiconductor layers 320 and 122 can include semiconductor materials similar to or different from substrate 106. In some embodiments, first and second semiconductor layers 320 and 122 can include semiconductor materials with oxidation rates and/or etch selectivity different from each other. In some embodiments, each of first and second semiconductor layers 320 and 122 can include silicon germanium (SiGe) with Ge in a range from about 25 atomic percent to about 50 atomic percent (e.g., about 30 atomic percent, 35 atomic percent, or about 45 atomic percent) with any remaining atomic percent being Si or can include Si without any substantial amount of Ge.

First and/or second semiconductor layers 320 and 122 can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 320 and 122 can have respective vertical dimensions $320t$ and $122t$ (e.g., thicknesses) along a z-axis, each ranging from about 6 nm to about 10 nm (e.g., about 7 nm, about 8 nm, or about 9.5 nm). Vertical dimensions $320t$ and $122t$ can be equal to or different from each other. Though four layers of semiconductor layers 320 and 122 are shown in FIGS. 3A-3C, semiconductor device 100 can have any number of semiconductor layers 320 and 122.

Forming fin base portion 108A and fin top portion 108B* can include forming a stack of materials for first and second semiconductor layers 320 and 122 on substrate 106 and etching a portion of substrate 106 and the stack of materials through patterned hard mask layers 340 and 342 formed on the stack of materials. In some embodiments, hard mask layer 340 can be a thin film including silicon oxide formed, for example, using a thermal oxidation process. In some embodiments, hard mask layer 342 can be formed of silicon nitride using, for example, low pressure chemical vapor deposition (LPCVD) or plasma enhanced CVD (PECVD). The etching of the stack of materials can include a dry etch, a wet etch process, or a combination thereof. The dry etch process can include using etchants having an oxygen-containing gas, a fluorine-containing gas, a chlorine-containing gas, a bromine-containing gas, an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, fin base portion 108A and fin top portion 108B* can have respective vertical dimensions $H_1$ and $H_2$ (e.g., heights) along a z-axis, each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm (e.g., about 85 nm, about 90 nm, about 100 nm, or about 115 nm). In some embodiments, fin structure 108 can have a horizontal dimension $L_1$ (e.g., length) along an x-axis ranging from about 100 nm to about 1 μm (e.g., about 200 nm, about 300 nm, about 500 nm, about 750 nm, or about 900 nm). In some embodiments, fin structure 108 can have a tapered cross-section along a yz-plane with a horizontal dimension $W_1$ (e.g., width) of fin base portion 108B along a y-axis being greater than a horizontal dimension $W_2$ of fin top portion 108B along a y-axis. Horizontal dimension $W_1$ and $W_2$ can range from about 6 nm to about 20 nm (e.g., about 6 nm, about 8 nm, about 10 nm, about 15 nm, about 17 nm, or about 20 nm).

Figure 4A:
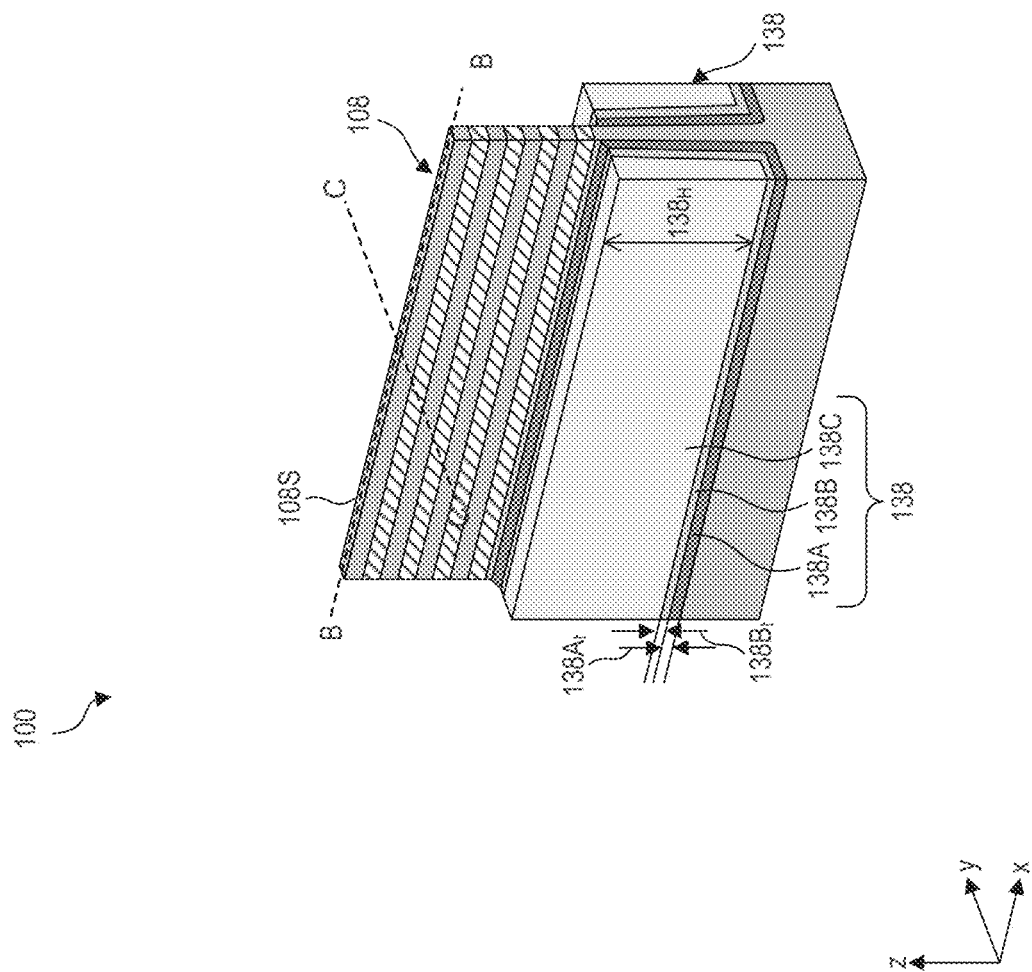
Figure 4C:
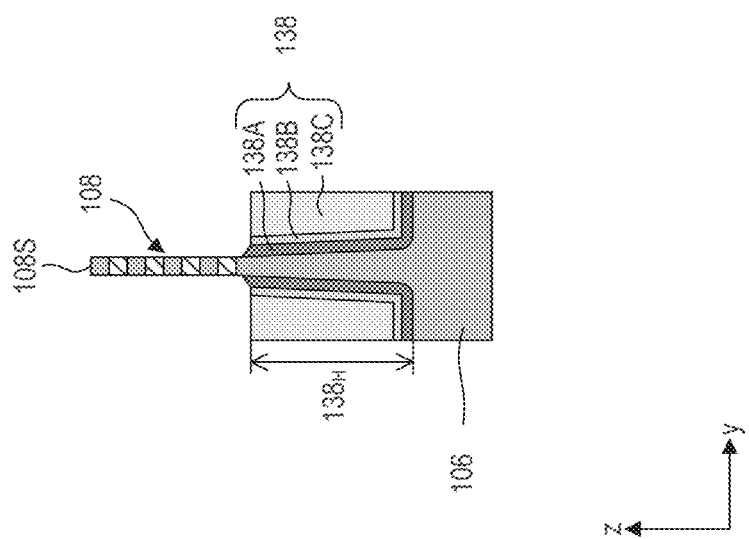
Figure 4B:
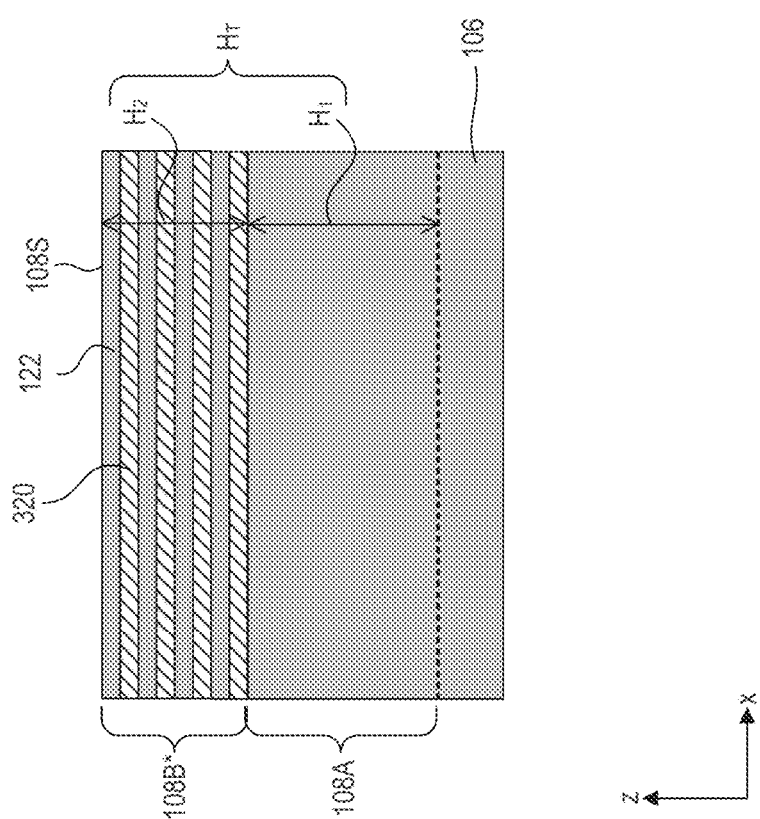
Figure 5A:
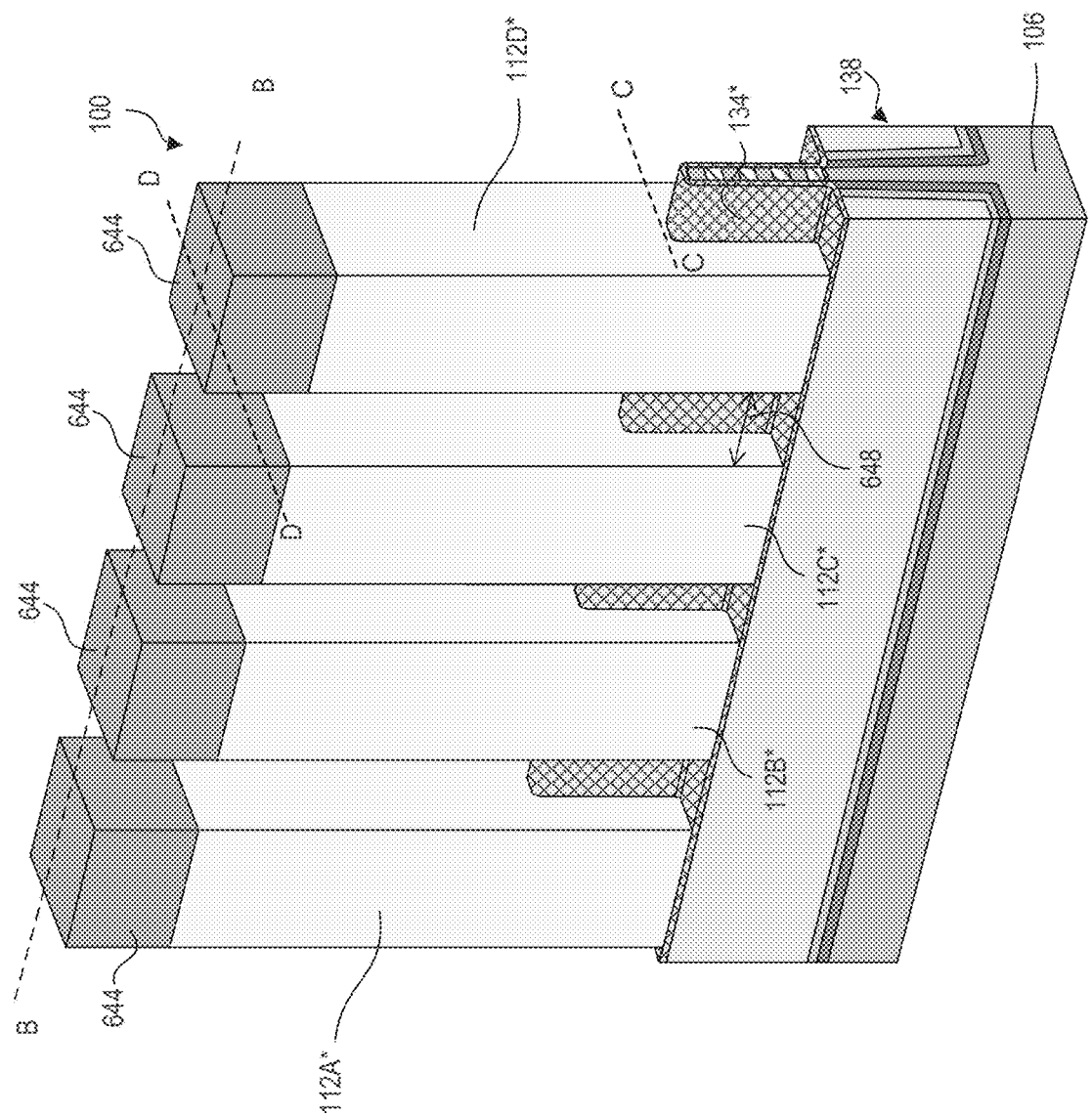
Figure 5B:
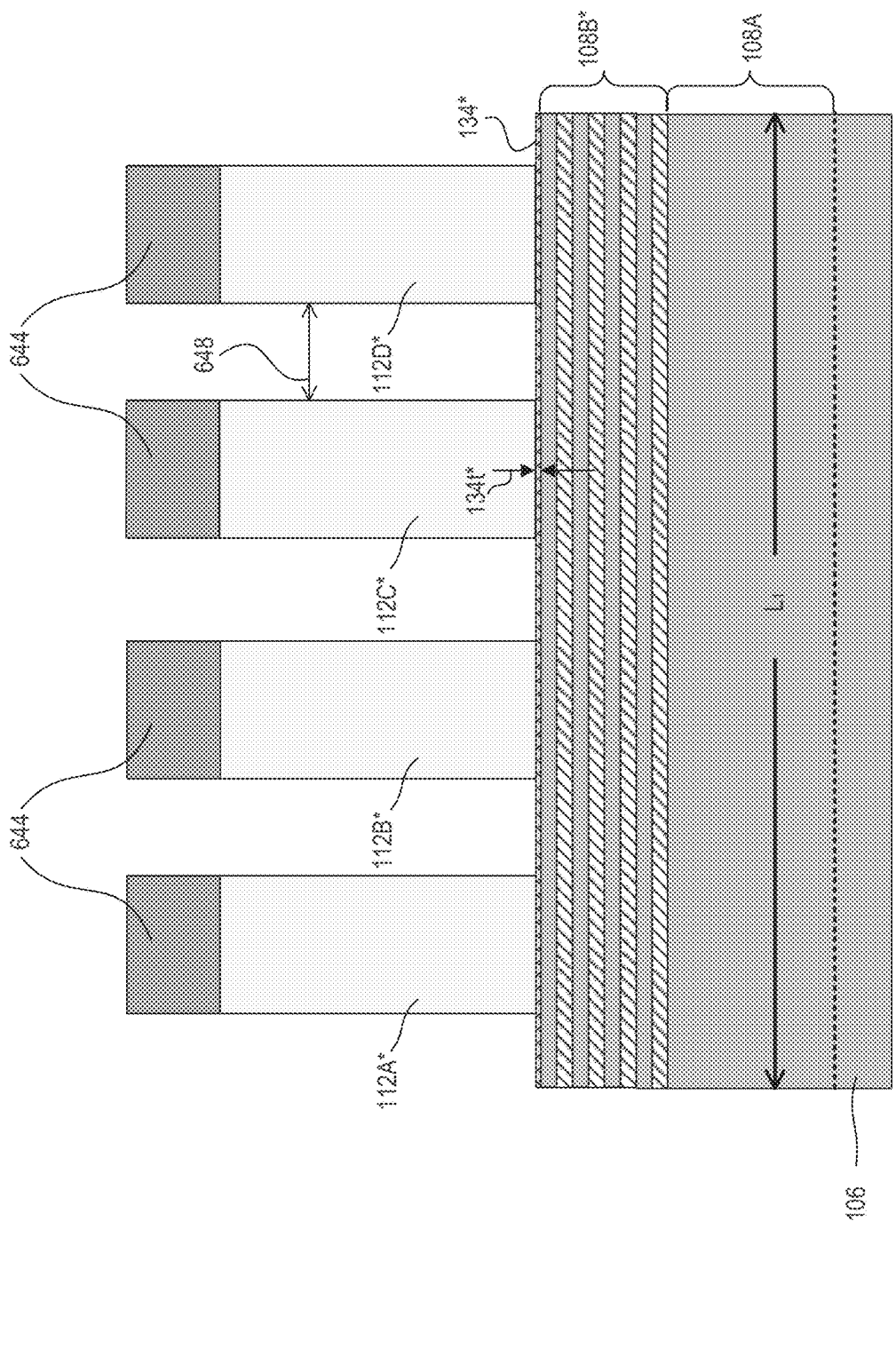
Figure 5D:
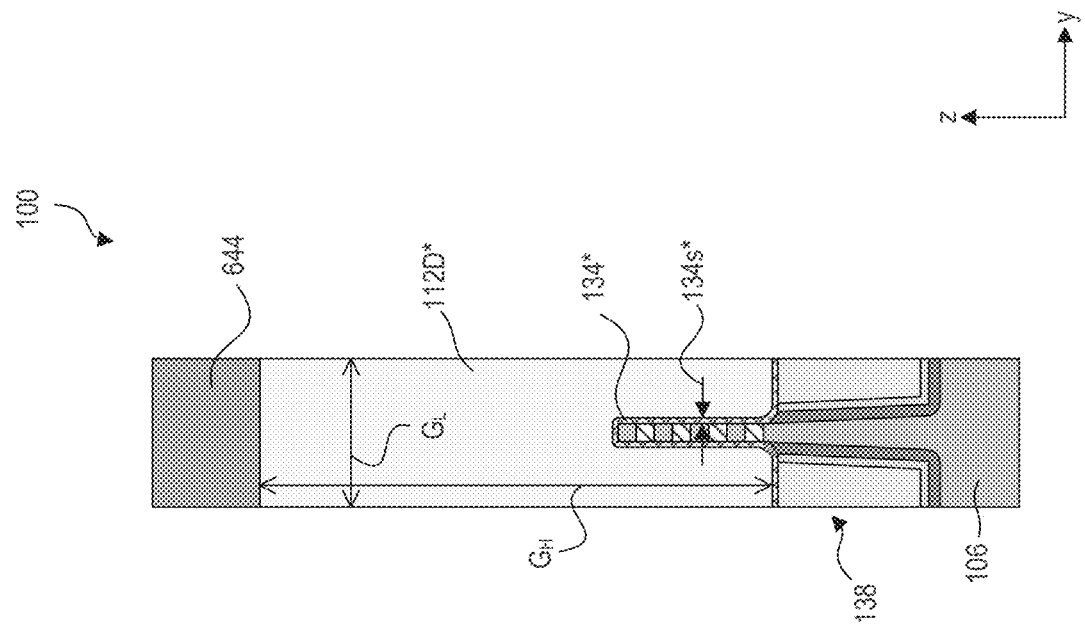
Figure 5C:
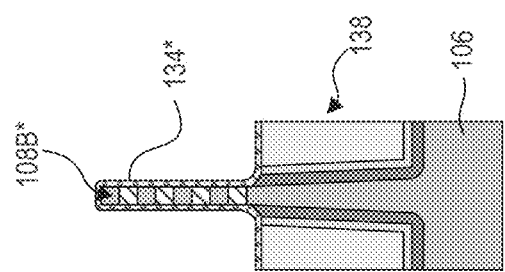
Figure 6A:
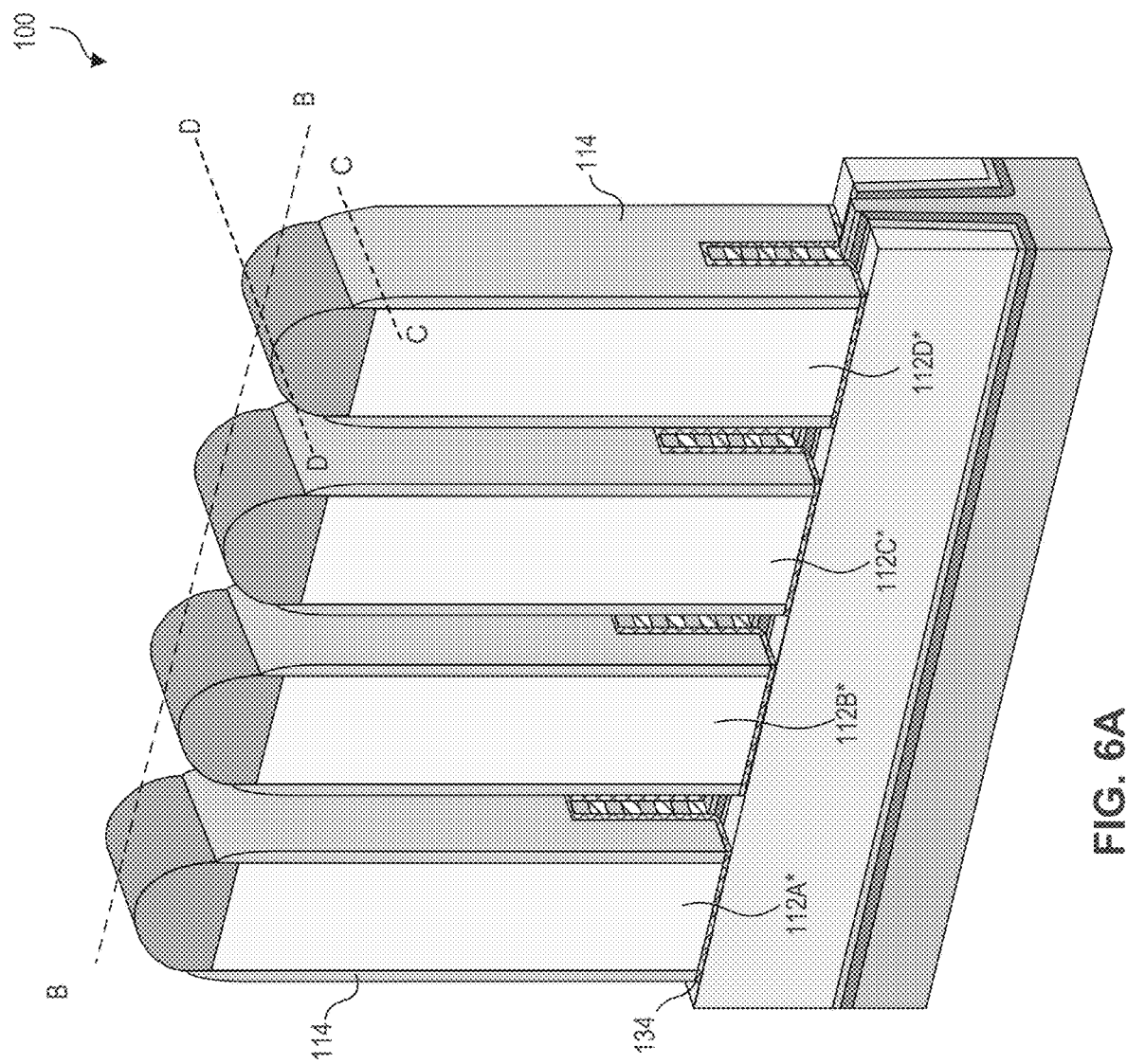
Figures 6C, 6D:
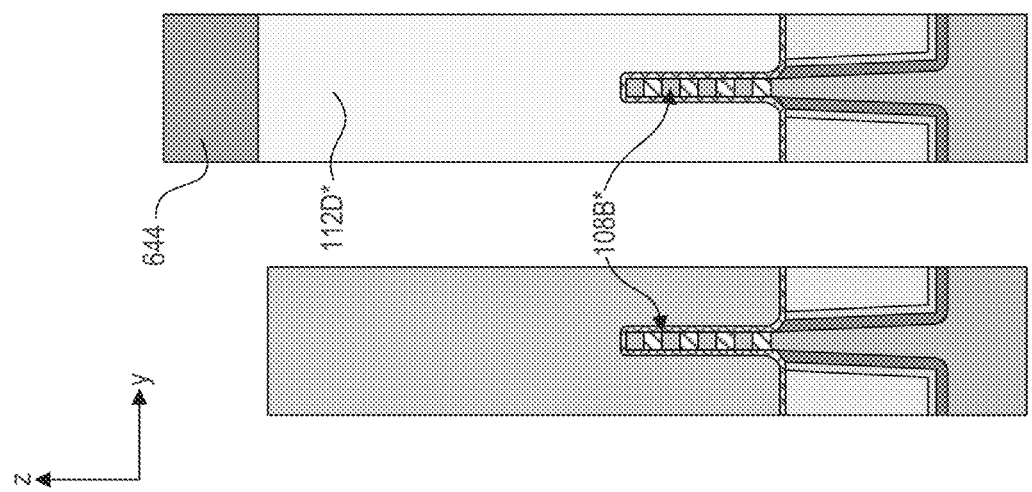
Figure 6B:
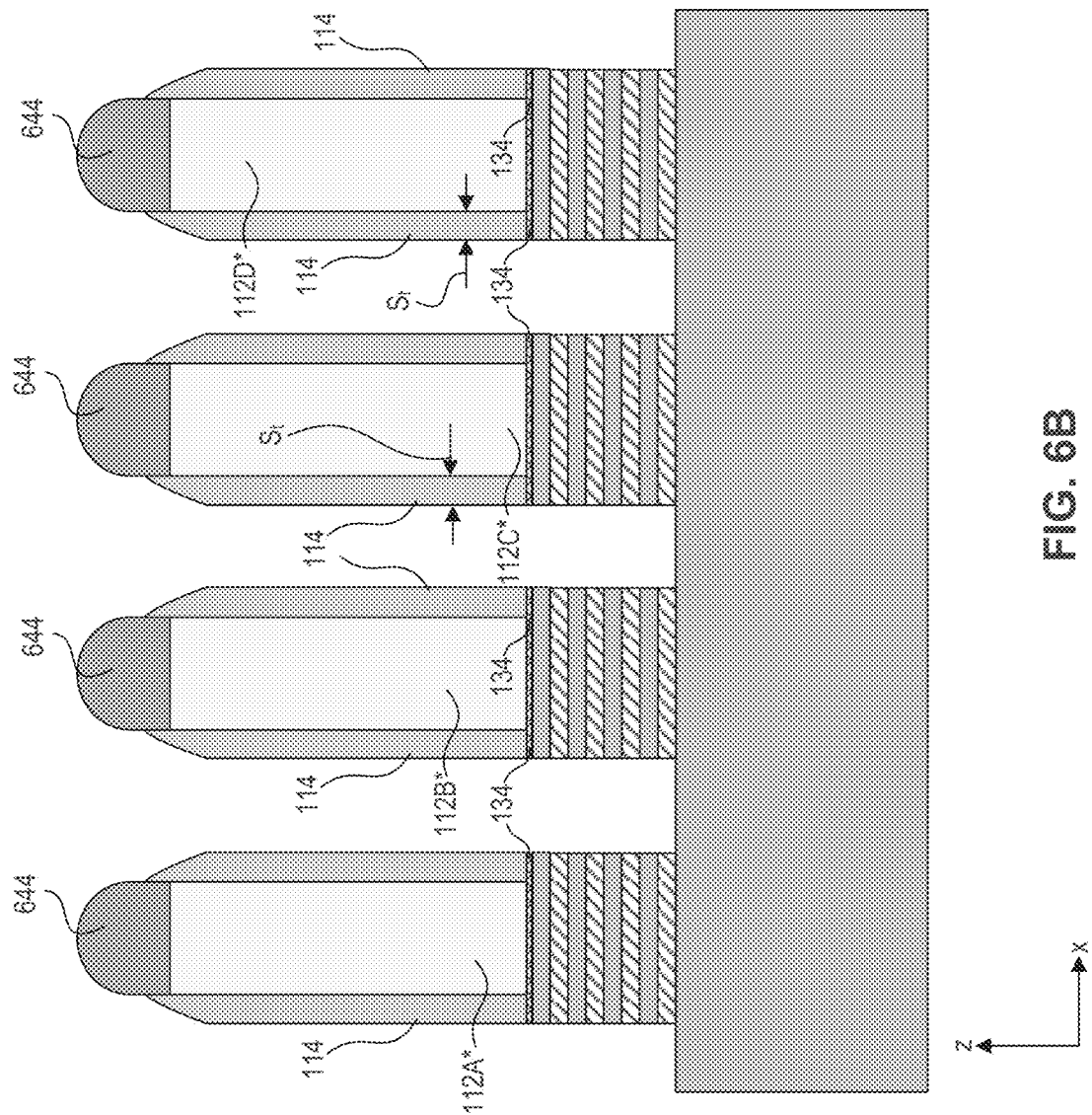

Referring to FIG. 2, in operation 210, STI regions are formed on the substrate, according to some embodiments. Referring to FIGS. 4A-4C, STI regions 138 with first and second protective liners 138A-138B and insulating layer 138C can be formed on substrate 106. Forming STI regions 138 can include (i) depositing a layer of nitride material (not shown) for first protective liners 138A on the structure of FIG. 3A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 4A.

The layers of nitride and oxide materials can be deposited using a suitable process for depositing oxide and nitride materials, such as ALD or CVD. These layers of oxide and nitride materials can prevent oxidation of the sidewalls of fin top portion 108B* during the deposition and annealing of the insulating material for insulating layer 138C.

In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove the patterned hard mask layers 340 and 343 and portions of the layers of nitride, oxide, and insulating materials for layers 138A-138C to substantially coplanarize top surfaces of the layers of nitride, oxide, and insulating materials with top surface 108s (FIGS. 4A-4C) of fin structure 108. The CMP process can be followed by the etching process to etch the layers of nitride, oxide, and insulating materials to form the structure of FIG. 4A.

The etching of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($C_2$), and $O_2$, hydrogen bromide (HBr), $O_2$, and He, or a combination thereof with a pressure ranging from about 1 mTor to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the wet etch process can each range from about 10 sccm to about 100 sccm (e.g., about 20 sccm, 30 sccm, or 40 sccm). In some embodiments, the wet etch process can be performed at a pressure ranging from about 5 mTorr to about 100 mTorr (e.g., about 20 mTorr, about 30 mTorr, or about 40 mTorr) and a high temperature ranging from about 50° C. to about 120° C.

In some embodiments, first and second protective liners 138A-138B can have respective thicknesses 138At and 138Bt ranging from about 1 nm to about 2 nm. In some embodiments, STI regions 138 can have a vertical dimension $138_H$ (e.g., height) along a z-axis ranging from about 40 nm to about 60 nm (e.g., about 45 nm, about 50 nm, or about 55 nm). In some embodiments, vertical dimension $138_H$ can be half of the total height $H_T$ of fin structure 108. Other materials, formation methods, and dimensions for STI regions 138 are within the scope and spirit of this disclosure.

Referring to FIG. 2, in operation 215, a protective oxide layer is formed on the fin structure and polysilicon structures are formed on the protective oxide layer, according to some embodiments. For example, as shown in FIGS. 5A-5D, a protective oxide layer 134* can be formed on fin structure 108 and STI regions 138 and polysilicon structures 112A*-112D* can be formed on protective oxide layer 134*. The formation of protective oxide layer 134* can include blanket depositing a layer of oxide material on the structure of FIG. 4A followed by a high temperature anneal process. Protective oxide layer 134* can include a suitable oxide material, such as silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be deposited using PEALD at an energy ranging from about 400 W to about 500 W and at a temperature ranging from about 300° C. to about 500° C. The deposition of the layer of oxide material can be followed by a dry anneal process under oxygen gas flow at a temperature ranging from about 800° C. to about 1050° C. The oxygen precursor concentration can be in a range of about 0.5% to about 5% of the total gas flow rate. In some embodiments, the anneal process can be a flash process where the anneal time can be between about 0.5 s and about 5 s (e.g., about 1 s, about 2 s, or about 5 s).

In some embodiments, protective oxide layer 134* can have a vertical dimension 134t* (e.g., thickness on top surface of fin structure 108) along a z-axis and a horizontal dimension 134s* (e.g., thickness on sidewalls of fin top portion 108B) along a y-axis, each ranging from about 1 nm to about 3 nm (e.g., about 1 nm, or 2 nm). In some embodiments, dimension 134t* can be equal to or greater than dimension 134s*. Other oxide materials, formation methods, and thicknesses for protective oxide layer 134* are within the scope and spirit of this disclosure. The presence of protective oxide layer 134* allow etching polysilicon from high aspect ratio spaces 646 (e.g., aspect ratio greater than 1:15, 1.18, or 1:20) shown in FIG. 5A between adjacent polysilicon structures 112A*-112D* without substantially etching and/or damaging fin structure 108 during the formation of polysilicon structures 112A*-112D*.

In some embodiments, protective oxide layer 134* can be removed during a subsequent gate replacement process when finFETs 102A-102D are used as non-input/output (non-I/O) devices in core circuits (can be also referred to as "logic circuits" or "memory circuits") formed in core regions (can be also referred to as "logic regions" or "memory regions") of an integrated circuit (IC). In some embodiments, the non-I/O devices can be core devices, logic devices, and/or memory devices that are not configured to handle the input/output voltages/currents directly. In some embodiments, the non-I/O devices includes logic gates such as, for example, NAND, NOR, INVERTER, or a combination thereof. In some embodiments, the non-I/O devices include a memory device, such as a static random-access memory (SRAM) device. In some embodiments, protective oxide layer 134* may not be removed and can form a part of gate dielectric layers of gate structures 112 when finFETs 102A-102B are used as an I/O device in peripheral circuits (e.g., IO circuits) formed in peripheral regions (can be also referred to as "I/O regions" or "high voltage regions") of an IC. The I/O devices can be configured to handle the input/output voltages/currents of the IC and to tolerate a greater amount of voltage or current swing than the non-I/O devices.

The formation of protective oxide layer 134* can be followed by the formation of polysilicon structures 112A*-112D* as shown in FIGS. 5A-5D. During subsequent processing, polysilicon structures 112A*-112D* can be replaced in a gate replacement process to form gate structures 112 of finFETs 102A-102D, respectively, as shown in FIG. 1A. In some embodiments, the formation of polysilicon structures 112A*-112D* can include blanket depositing a layer of polysilicon material on the deposited protective oxide layer 134* and etching the layer of polysilicon material through a patterned hard mask layer 644 (shown in FIGS. 5A-5D) formed on the layer of polysilicon material. In some embodiments, polysilicon material can be undoped and hard mask layer 644 can include an oxide layer and/or a nitride layer. The oxide layer can be formed using a thermal oxidation process and the nitride layer can be formed by LPCVD or PECVD. Hard mask layer 644 can protect polysilicon structures 112A*-112D* from subsequent processing steps (e.g., during formation of spacers 114, epitaxial fin regions 110, and/or ILD layer 118).

The blanket deposition of the layer of polysilicon material can include CVD, PVD, ALD, or other suitable deposition processes. In some embodiments, etching of the deposited layer of polysilicon material can include a dry etch, a wet etching, or a combination thereof. In some embodiments, etching of the deposited layer of polysilicon material to form polysilicon structures 112A*-112D* can include four etching steps. The first polysilicon etch step can include using a gas mixture having hydrogen bromide (HBr), oxygen ($O_2$), fluoroform (CHF), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structure 108. The second, third, and fourth polysilicon etch steps are used to etch unwanted portions of the blanket deposited layer of polysilicon material within high aspect ratio spaces 646.

In some embodiments, vertical dimensions $G_H$ of polysilicon structures 112A*-112D* along a z-axis can be in a range from about 100 nm to about 150 nm (e.g., about 100 nm, about 120 nm, about 135 nm, or 150 nm). In some embodiments, horizontal dimensions $G_L$ of polysilicon structures 112A*-112D* along an x-axis can be in a range from about 3 nm to about 30 nm (e.g., about 3 nm, about 5 nm, about 7 nm, about 10 nm, about 12 nm, about 15 nm, about 20 nm, or about 30 nm). Polysilicon structures 112A*-112D* can have a high aspect ratio equal to or greater than about 9 (e.g., about 10, about 12, about 15, about 18, or about 20), where aspect ratio is a ratio of dimension $G_H$ to dimension $G_L$. In some embodiments, horizontal dimensions 648 along an x-axis (e.g., spacing) between adjacent polysilicon structures 112A*-112D* can be in a range from about 40 nm to about 90 nm (e.g., about 40 nm, about 50 nm, about 60 nm, about 80 nm, or about 90 nm). In some embodiments, horizontal dimensions 648 can be different between adjacent polysilicon structures. The sum of a value of dimension 648 and a value of dimension G is referred to as "one contacted poly pitch (1 CPP)." In some embodiments, horizontal dimension $L_1$ of fin structure along an x-axis can be at least 3 CPP to prevent the relaxation of strain in fin structure 108, and consequently prevent the relaxation of strain in channel regions formed in stacked fin portions of second semiconductor layers 122 under gate structures 112 as discussed above.

Referring to FIG. 2, in operation 220, spacers are formed on sidewalls of the polysilicon structures and fin top portions are etched, according to some embodiments. Referring to FIGS. 6A-6D, spacers 114 can be formed on sidewalls of polysilicon structures 112A*-112D*. Forming spacers 114 can include blanket depositing a layer of an insulating material (e.g., an oxide, a nitride, and/or silicon carbon oxynitride material) on the structure of FIG. 5A by a CVD, a PVD, or an ALD process followed by photolithography and an etching process (e.g., reactive ion etching or other dry etching process using a chlorine or fluorine based etchant). Spacers 114 can each have a horizontal dimension $S_t$ (e.g., thickness) along an x-axis ranging from about 5 nm to about 12 nm, according to some embodiments. Forming of spacers 114 can be followed by forming oxide layer 134 (shown in FIGS. 6A-6D) underlying polysilicon structures 112A*-112D* by etching protective oxide layer 134* from regions not covered by polysilicon structures 112A*-112D* and spacers 114. The etch process can include a wet etch process using, for example, diluted HF.

A vertical etch of portions of fin top portion 108B* can be performed after forming oxide layer 134. The vertical etch includes etching fin top portion 108B* that are not underlying spacers 114 and polysilicon structures 112A*-112D* and can include a biased etching process. The biased etching process can be performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. During the biased etching process, polysilicon structures 112A*-112D* can be protected from being etched by hard mask layer 644 and spacers 114.

Figure 7A:
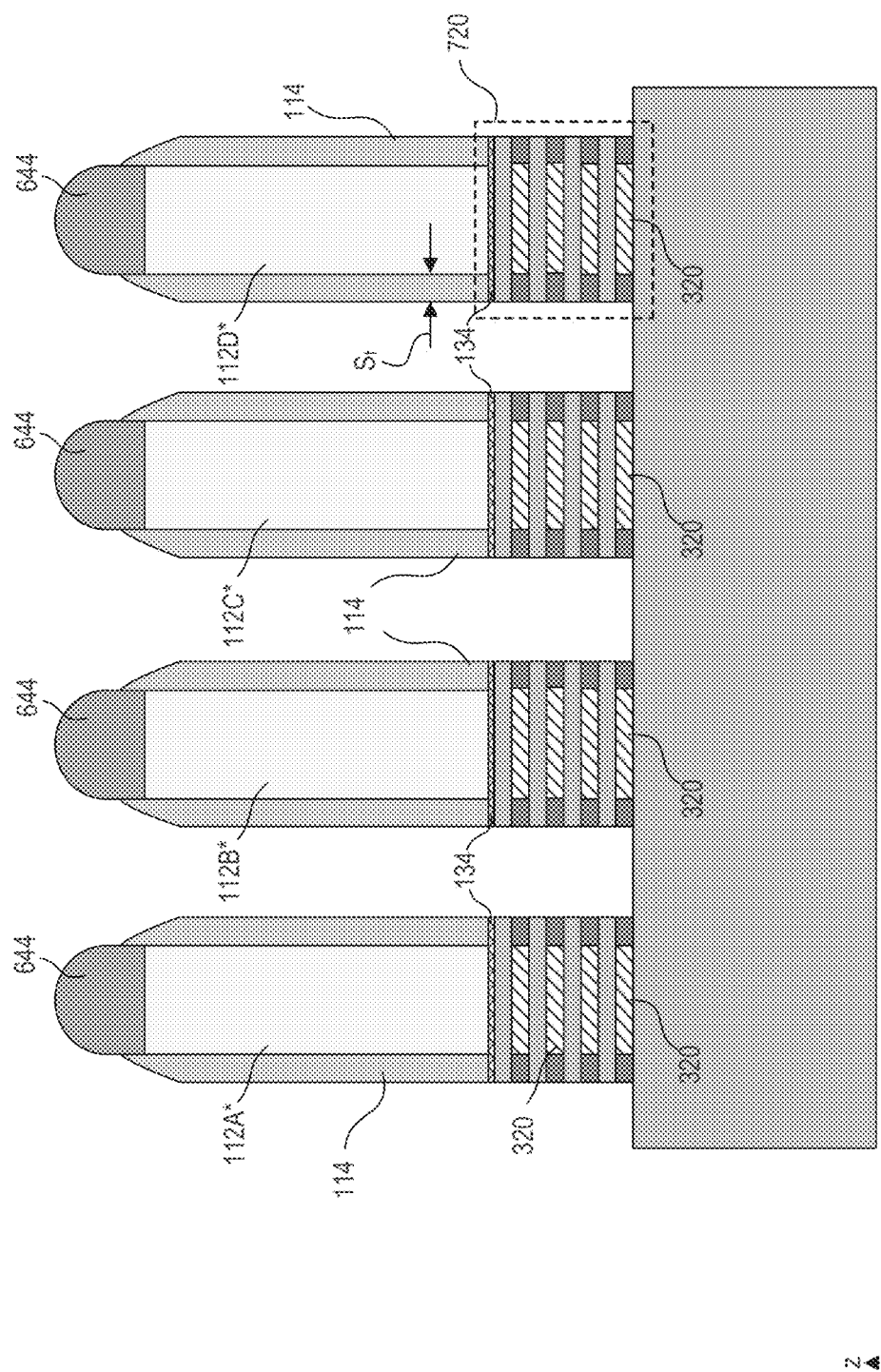
Figure 7C:
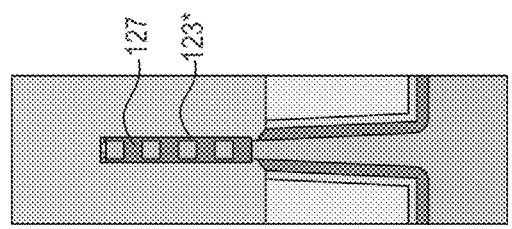
Figure 7B:
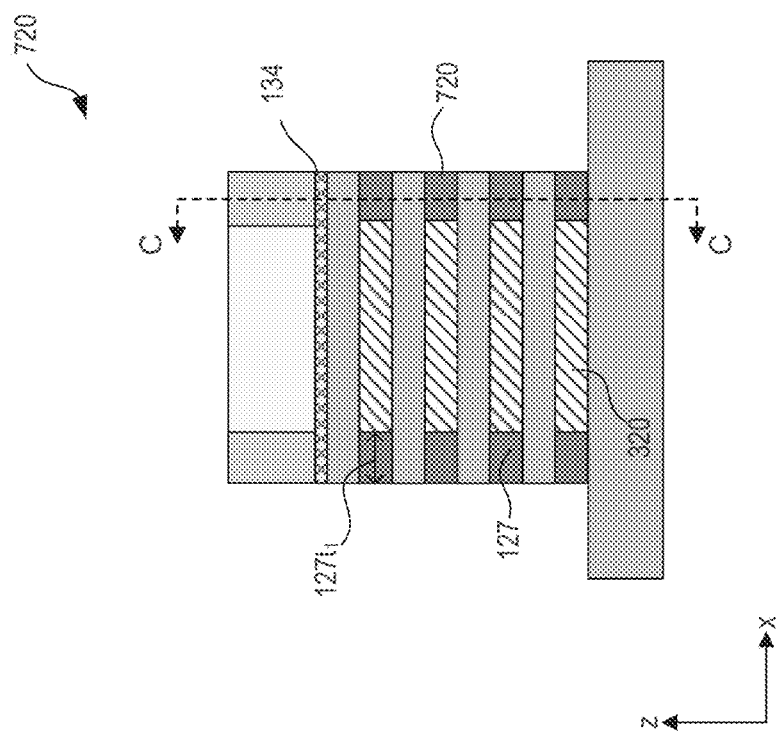

Referring to FIG. 2, in operation 225, a horizontal etch process is performed and inner spacer structures are formed in the fin structure, according to some embodiments. Referring to FIGS. 7A-7C, the vertical etch of the portions of fin top portions 108B* can be followed by a horizontal etch of portions of first semiconductor layers 320 below polysilicon structures 112A*-112D* and spacers 114 to form recessed regions. FIG. 7B is an enlarged view of region 720 shown in FIG. 7A. FIG. 7C is a cross-sectional view of the structure illustrated in FIG. 7B as viewed from the lines of C-C. The horizontal etch can be performed by a dry etching process, a wet etching process, or a combination thereof. The etching process can include a plurality of cycles of etching and purging processes, such as about 3 to about 20 cycles of etching and purging processes. The etching process in each cycle can include using a gas mixture having hydrogen fluoride (HF), nitrogen trifluoride ($NF_3$), a fluorine based gas and a chlorine based gas. The gas ratio of the gas mixture of HF and $NF_3$ to the fluorine based gas can range from about 2 to about 30 (e.g., about 2, about 5, about 10, about 15, about 20, or about 30). The gas ratio of the gas mixture HF and $NF_3$ to the chlorine based gas can range from about 2 to about 40 (e.g., about 2, about 5, about 10, about 15, about 20, about 30, or about 40). The purging process in each cycle can include using a gas mixture having HF and nitrogen ($N_2$). HF in the purging process can remove by-product and/or clean the surface of etched portions for subsequent cycles. The purging process can be longer than the etching process in each cycle.

The process of forming recess regions can be followed by a blanket deposition of a dielectric material layer and a horizontal etch of the blanket deposited dielectric material layer to form inner spacer structures 127 within the recessed regions. In some embodiments, the blanket deposition process can include a plurality of cycles of deposition and etch processes. In each cycle, the etch process can follow the deposition process to prevent the formation of voids within inner spacer structures 127 by removing seams that can be formed during deposition of dielectric material layer within the recessed regions.

Inner spacer structures 127 can include a single layer or a stack of dielectric layers, deposited by ALD, FCVD, or other suitable methods. The etch process in each cycle of the blanket deposition process of dielectric material layer can include a dry etch process using a gas mixture of HF and $NH_3$. The gas ratio of HF to $NH_3$ can range from about 1 to about 20 (e.g., about 1, about 5, about 10, about 15, or about 20). Inner spacer structures 127 can include suitable dielectric material composed of silicon, oxygen, carbon, and/or nitrogen. Carbon concentration can be low in the dielectric material and can range from about 1% to about 15% (e.g., about 1.5%, about 2.5%, about 5%, about 10%, or about 13%) because carbon concentration in the dielectric material outside this range can lead to longer etch time and reduced etch selectivity.

The horizontal etch process of the blanket deposited dielectric material layer to form inner spacer structures 127 can be performed by a dry etch process using a gas mixture of HF and $NH_3$. The gas ratio of HF to $NH_3$ can range from about 1 to about 20 (e.g., about 1, about 5, about 10, about 15, or about 20). In some embodiments, inner spacer structures 127 can have a dimension $127t_1$ (e.g., thickness) along an x-axis ranging from about 3 nm to about 12 nm (e.g., about 3 nm, about 5 nm, about 8 nm, or about 10 nm). Other methods of deposition and horizontal etch processes for forming inner spacer structures 127 and other suitable dimensions of inner spacer structures 127 are within the scope and spirit of this disclosure.

Figure 8A:
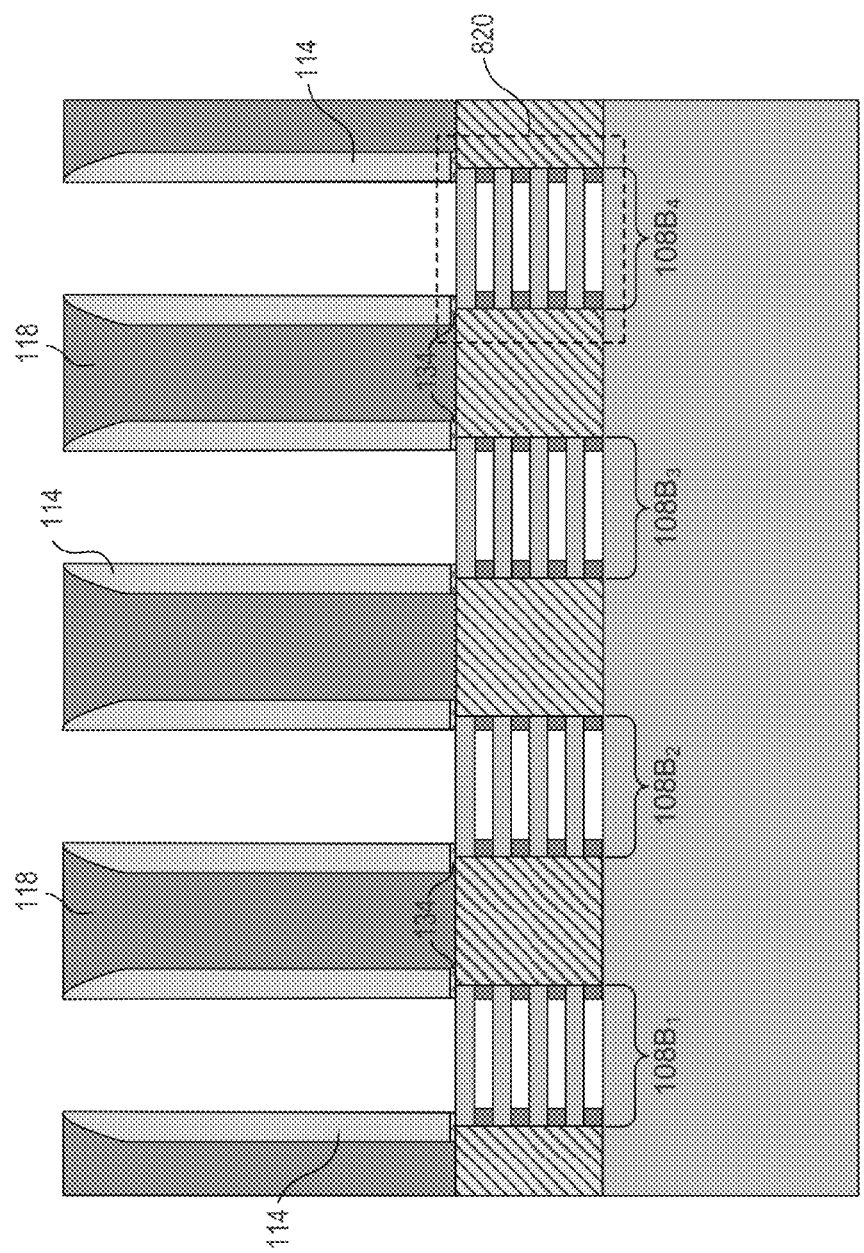
Figure 8C:
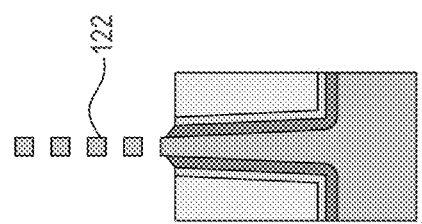
Figure 8B:
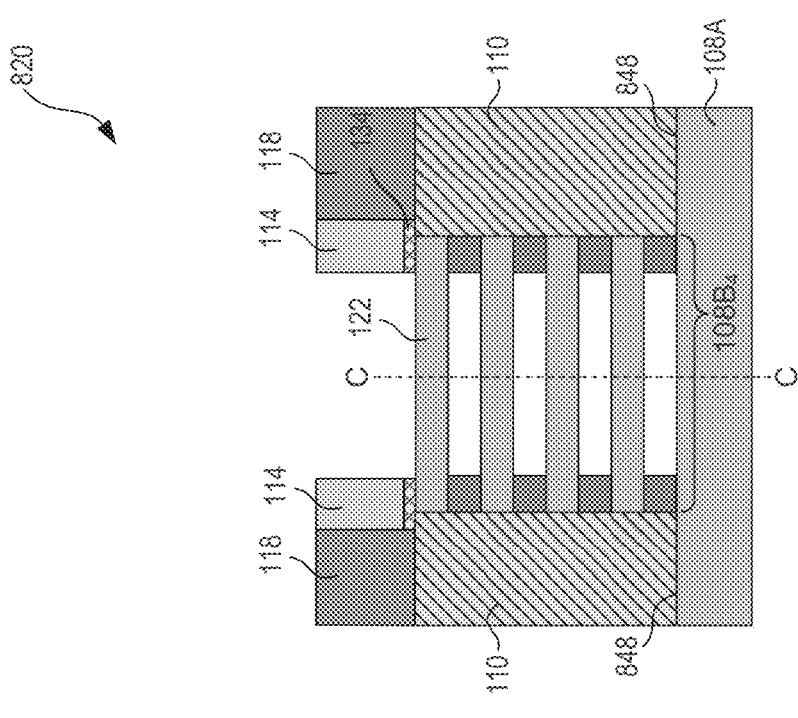

Referring to FIG. 2, in operation 230, epitaxial fin regions are formed on the fin structure and nanowires are formed between the epitaxial fin regions. Referring to FIGS. 8A-8C, epitaxial fin regions 110 can be grown on exposed surfaces of fin base portion 108A and on exposed surfaces of second semiconductor layers 122 of the structure of FIG. 7A. FIG. 8B is an enlarged view of region 820 illustrated in FIG. 8A. FIG. 8C is a cross-sectional view of the structure in FIG. 8B along the line C-C.

In some embodiments, a portion of epitaxial fin regions 110 can be under spacers 114 and/or extend into fin base portion 108A. In some embodiments, epitaxial fin regions 110 can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. In some embodiments, epitaxial fin regions 110 can be grown by selective epitaxial growth (SEG), where an etching gas is added to promote the selective growth of semiconductor material on the exposed surfaces of second semiconductor layers 122 and fin base portion 108A, but not on insulating materials.

In some embodiments, epitaxial fin regions 110 can be p-type or n-type. In some embodiments, p-type epitaxial fin regions 110 can include SiGe and can be in-situ doped during the epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type epitaxial fin regions 110 can include Si without any substantial amount of Ge and can be in-situ doped during the epitaxial growth process using n-type dopants, such as phosphorus or arsenic. For n-type in-situ doping, n-type doping precursors such as, but not limited to, phosphine (PH), arsine ($AsH_3$), and/or other n-type doping precursor can be used.

Each epitaxial fin region 110 can form S/D regions for finFETs 102A-102D. Second semiconductor layers 122 underlying polysilicon structures 112A*-112D* and interposed between adjacent S/D regions can form the channel regions of finFETs 102A-102D. In subsequent processing, gate-all-around (GAA) structures can be formed to wrap around each of the channel regions by replacing first semiconductor layers 320 (shown in FIGS. 7A-7B) of stacked fin portions $108B_1$-$108B_4$ underlying polysilicon structures 112A*-112D* with one or more layers of gate structures 112.

In some embodiments, fin base portion 108A underlying the etched portions of fin top portion 108B between spacers 114 can be recessed during the vertical etch process described in operation 225. Interfaces 848 between epitaxial fin regions 110 and fin base portion 108A can be on the same plane as top surfaces of STI regions 138 or can be below the top surface planes of STI regions 138. Other dimensions and structures for epitaxial fin regions 110 are within the scope and spirit of this disclosure.

The process of forming epitaxial regions 110 can be followed by removing first semiconductor layers 320 of stacked fin portions $108B_1$-$108B_4$ to form nanowire shaped second semiconductor layers 122, as shown in FIGS. 8A-8C. First semiconductor layers 320 can be removed by an etching process performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. Other etching methods are within the scope and spirit of this disclosure.

Removing first semiconductor layers 320 can be followed by forming an etch stop layer (ESL) (not shown) on spacers 114 and on epitaxial fin regions 110. The formation of ILD layer 118 on the ESL can use a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using a FCVD process. The deposition process can be followed by a thermal annealing of the deposited layer of dielectric material in steam at a temperature ranging from about 200° C. to about 700° C. for a period ranging from about 30 minutes to about 120 minutes.

The process of forming ILD layer 118 can be followed by removing polysilicon structures 112A*-12D* using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structures 112A*-112D*, or a dry etch followed by a wet etch process can be used to remove polysilicon structures 112A*-112D*. The exposed portions of oxide layer 134 can be removed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. In some embodiments, oxide layer 134 may not be removed.

Figure 9A:
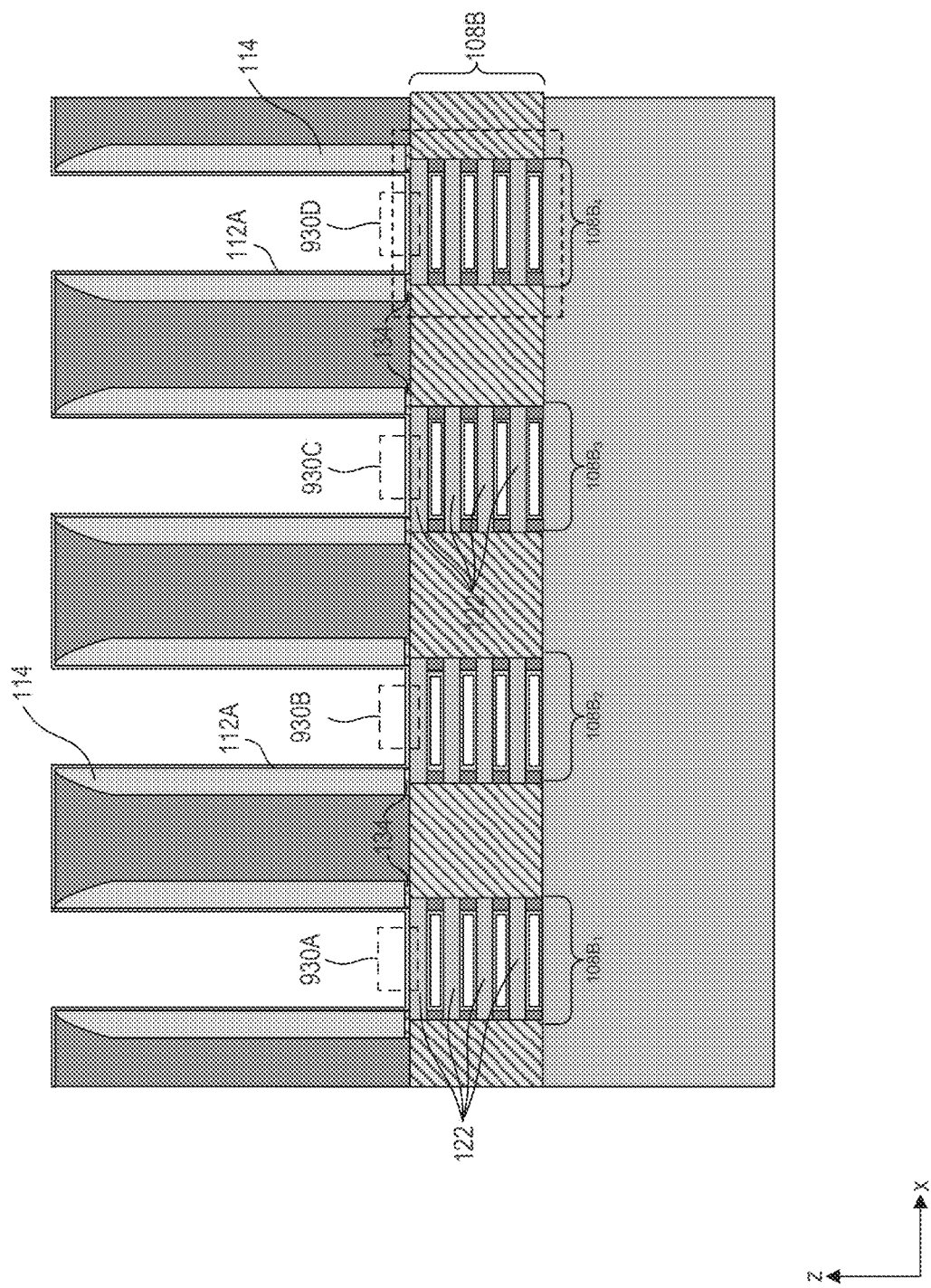

Referring to FIG. 2, in operation 235, gate dielectric layers are formed on the nanowires. Referring to FIGS. 9A-9C, gate dielectric layers 112A can be wrapped around on exposed nanowire shaped second semiconductor layers 122 of stacked fin portions $108B_1$-$108B_4$. Forming gate dielectric layers 112A can include a blanket deposition process of a suitable gate dielectric material layer. The gate dielectric material layer for gate dielectric 112A can be blanket deposited on the structure of FIG. 8A. Gate dielectric layer 112A can be formed with a thickness $112t$ ranging from about 1.5 nm to about 2 nm (e.g., about 1.5 nm, about 1.7 nm, about 1.8 nm, or about 2 nm). The gate dielectric material of gate dielectric layer 112A are described above with reference to FIGS. 1A-1D and are not described here in detail for simplicity. In some embodiments, an interlayer dielectric (not shown in FIGS. 9A-9C) is disposed prior to the deposition of gate dielectric layers 112A. In some embodiments, the interlayer dielectric can have a thickness of about 10 Å. In some embodiments, the thickness of the interlayer dielectric can be between about 8 Å and about 12 Å. In some embodiments, thickness of gate dielectric layer 112A can be between about 10 Å and about 20 Å (e.g., between about 10 Å and about 15 Å or between about 15 Å and about 20 Å). For example, thickness of gate dielectric layer 112A can be about 15 Å. Other deposition methods and dimensions of gate dielectric layers 112A are within the scope and spirit of this disclosure.

Figure 10:
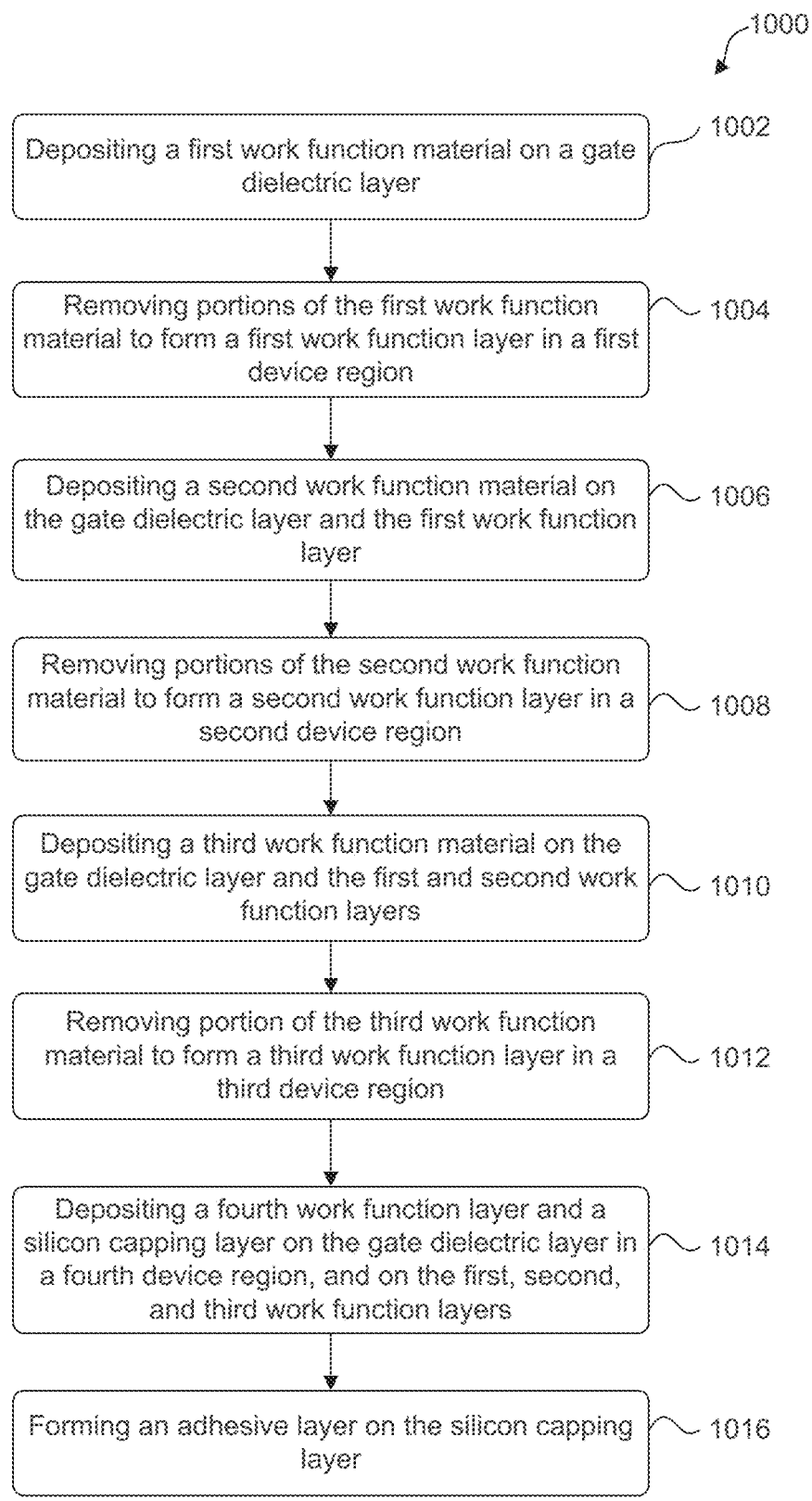
FIG. 10 is a flow diagram of a method for forming multiple work function layers for multi-threshold semiconductor devices, in accordance with some embodiments.

Referring to FIG. 2, in operation 240, work function layers are formed on gate dielectric layers, according to some embodiments. Work function layers 130A-130D are respectively formed as components of finFETs 102A-102D. FIG. 10 is a flow diagram of a method 1000 for forming work function layers on gate dielectric layers, according to some embodiments. Method 1000 can include multiple process cycles, where each process cycle can include one or more deposit, block, and etch processes. Method 1000 is an example for performing operation 240. For illustrative purposes, the operations illustrated in FIG. 1000 will be described with reference to the example fabrication process as illustrated in FIGS. 11A-11K. FIGS. 11A-11K are enlarged views of regions 930A-930D in FIG. 9A to illustrate the exemplary fabrication flow of method 1000 for forming work function layers 130-130D, and other structures are omitted in FIGS. 11A-11K for simplicity. Operations in method 1000 can be performed in a different order or not performed depending on specific applications. It should be noted that method 1000 may not produce a complete semiconductor device. Accordingly, it is understood that additional processes can be provided before, during, and after method 1000, and that some other processes may only be briefly described herein.

Each work function layer 130A-130D formed using method 1000 can include one or more work function metal layers and can provide multi-threshold voltages across finFETs 102A-102D such that devices formed on substrate 106 can have different threshold voltages. In some embodiments, finFETs 102A and 102B are NFETs and finFETs 102C and 102D are PFETs. In some embodiments, finFETs 102A and 102D are low threshold voltage devices and finFETs 102B and 102C are high threshold voltage devices. The multiple work function layers can also reduce gate contact resistance by providing resistance match between layers. The resistance match can be achieved by adjusting the deposition parameters of the work function layers.

Figure 11A:
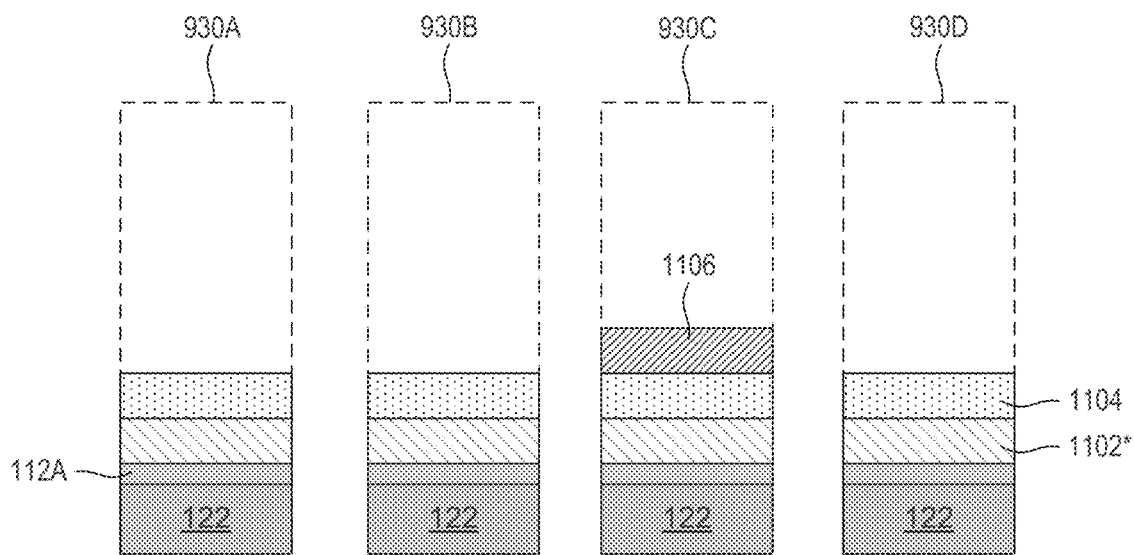
FIGS. 11A-11K illustrate various cross-sectional views of semiconductor devices with multiple work function layers at various stages of their fabrication process, in accordance with some embodiments.

Referring to FIG. 10, at operation 1002, a first work function material and a plurality of layers are deposited on the gate dielectric layer, according to some embodiments. Referring to FIG. 11A, a first work function material 1102* and a hard mask layer 1104 are disposed on gate dielectric layer 112A. A blocking layer 1106 is formed in region 930C and on hard mask layer 1104. In some embodiments, first work function material 1102* and hard mask layer 1104 are blanket deposited on gate dielectric layer 112A and other exposed surfaces of the semiconductor structure illustrated in FIGS. 9A-9C. As such, first work function material 1102* and hard mask layer 1104 are deposited in regions 930A-930D. In some embodiments, first work function material 1102* can be a tantalum nitride layer. In some embodiments, first work function material 1102* can be a work function layer for a p-type finFET device. For example, first work function material 1102* can include Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, thickness of first work function material 1102* can be between about 10 Å and about 20 Å. For example, first work function material 1102* can have a thickness of about 15 Å. A greater thickness of first work function material 1102* provides sufficient change in the threshold voltage of the semiconductor device but also leaves a smaller deposition window for subsequently formed layers. Hard mask layer 1104 can be blanket deposited on first work function material 1102*. In some embodiments, hard mask layer 1104 can be formed of suitable hard mask material, such as titanium nitride, silicon nitride, silicon carbide nitride, and any suitable material. For example, hard mask layer 1104 can be formed of titanium nitride. In some embodiments, thickness of hard mask layer 1104 can be between about 5 Å and about 15 Å. For example, hard mask layer 1104 can have a thickness of about 10 Å. First work function material 1102* and hard mask layer 1104 can be formed using deposition methods such as ALD, CVD, PVD, any suitable deposition methods, and/or combinations thereof. In some embodiments, first work function material 1102* can be deposited at a temperature between about 225° C. and about 325° C. For example, a deposition temperature can be between about 225° C. and about 275° C., between about 275° C. and about 300° C., between about 300° C. and about 325° C., or any other suitable temperatures. In some embodiments, first work function material 1102* can be deposited using Pentakis-dimethylamino Tantalum (PDMAT) and ammonia as precursors for depositing conformal tantalum nitride material. In some embodiments, the deposition chamber pressure can be between about 2 Torr and about 5 Torr. For example, the deposition chamber pressure can be between about 2 Torr and about 3 Torr, between about 3 Torr and about 5 Torr, or any other suitable chamber pressure.

In some embodiments, hard mask layer 1104 can be one or more hard mask layers. For example, hard mask layer 1104 can include a bi-layer structure that includes a first hardmask layer on first work function material 1102* and a second hardmask layer formed on the first hardmask layer. The first and second hard mask layers can be formed of different materials to improve etch selectivity which in turn provides improves protection for the underlying first work function material during subsequent etching processes. In some embodiments, the first hard mask layer can be a tantalum nitride layer and the second hard mask layer can be a titanium nitride layer. In some embodiments, the first hard mask layer can have a thickness between about 3 Å and about 8 Å. For example, the thickness of the first hard mask layer can be about 5 Å. In some embodiments, the second hard mask layer can have a thickness similar to the first hard mask layer. For example, the thickness of the second hard mask layer can be about 5 Å. In some embodiments, the second hard mask layer can have a thickness range different from that of the first hard mask layer. For example, the second hard mask layer can have a thickness range of 5 Å to about 10 Å. In some embodiments, the second hard mask layer can have thickness of about 10 Å. Because the bi-layer structure can be one or more types of material, it can provide a variation in etch selectivity which can provide protection against multiple etchants used in subsequent processes. In some embodiments, hard mask layer formed of tantalum nitride can be formed by an ALD process using pentakis (dimethylamido) tantalum (PDMAT) and ammonia as precursors. The ALD process can include multiple pulsing/purging cycles of the precursors that are repeated until a nominal thickness of the hard mask layer is reached. For example, the pulsing/purging cycles for forming the tantalum nitride hard mask layer can include at least about 10 pulsing/purging cycles to achieve a uniform layer. In some embodiments, additional pulsing/purging cycles can be used to achieve a greater thickness. In some embodiments, the ALD process for forming tantalum nitride hard mask layers can be performed at a chamber pressure between about 2 Torr and about 5 Torr. In some embodiments, a titanium nitride hard mask layer can be formed by ALD processes using titanium tetrachloride and ammonia as precursors. The pulsing/purging cycles used in the ALD process for forming titanium nitride hard mask layers can include at least about 30 pulsing/purging cycles to achieve a uniform layer. In some embodiments, more pulsing/purging cycles can be used to achieve a greater thickness. In some embodiments, the ALD process for forming titanium nitride hard mask layers can be performed at a temperature between about 400° C. and about 450° C. Hard mask layers can be removed after the etching of underlying layers. For example, titanium nitride hard mask layers can be removed by a suitable wet chemical etching process followed by a cleaning process such as a cleaning process using de-ionized water, ammonium hydroxide, and hydrogen peroxide. In some embodiments, tantalum nitride hard mask layers can be removed by a dry etching process, such as a plasma etching process using tantalum chloride.

Blocking layer 1106 can be formed on hard mask layer 1104 in region 930C. Blocking layer 1106 can be formed by blanket depositing blocking material on hard mask layer 1104 followed by a patterning process. For example, blocking layer 1106 can be formed of photoresist material, and forming blocking layer 1106 can include a patterning process of exposing the deposited photoresist material to a pattern, performing post-exposure bake processes, and developing the photoresist layer to form a masking element protecting underlying hard mask layer 1104 in region 930C.

Figure 11B:
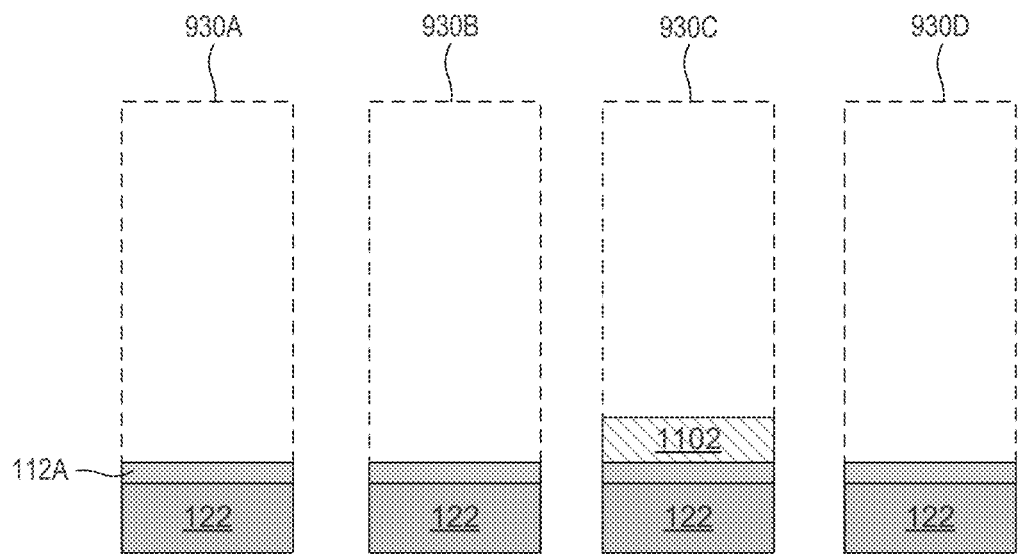

Referring to FIG. 10, at operation 1004, etching processes are performed to remove portions of the deposited first work function material to form a first work function layer in a first device region, according to some embodiments. Referring to FIG. 11B, etching processes are performed to remove hard mask layer 1104 and portions of first work function material not protected by blocking layer 1106. In some embodiments, hard mask material 1104 can be removed by a wet etch process. Hard mask layer 1104 can be etched away using chemical solutions, such as ammonium hydroxide, hydrogen peroxide, any suitable etching solutions, and/or combinations thereof. Hard mask layer 1104 can also be removed by dry etching. In some embodiments, the etching process continues until underlying first work function material 1102* is exposed. Exposed first work function material 1102* can be removed by a dry etch process, such as a dry etch process that includes etchants having an oxygen-containing gas, a fluorine-containing gas, a chlorine-containing gas (e.g., $Cl_2$, $CHCl_3$, $CCl_4$, and/or $BCl_3$), a bromine-containing gas, an iodine-containing gas, other suitable etching gases and/or plasmas, or combinations thereof. In some embodiments, first work function material 1102* formed using tantalum nitride can be etched away using tantalum chloride as a dry etching precursor. The etching process to remove portions of first work function material 1102* can be performed until the underlying gate dielectric 112A is exposed, as shown in FIG. 11B. The remaining first work function material 1102* forms a first work function material 1102 in a first device region such as region 930C.

Figure 11C:
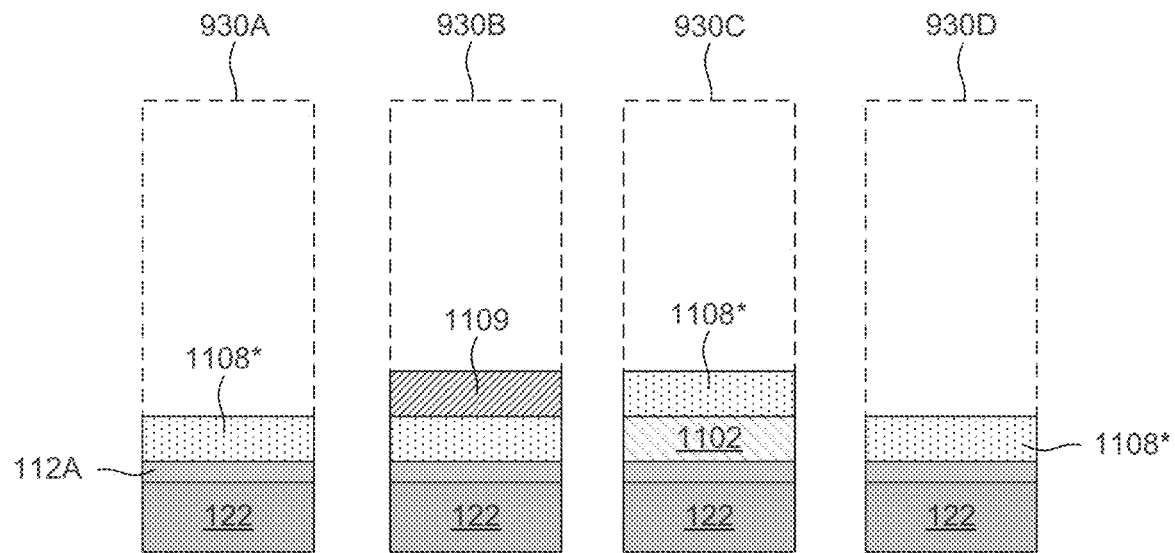

Referring to FIG. 10, at operation 1006, a second work function material is deposited on the gate dielectric layer and on the first work function layer, according to some embodiments. Referring to FIG. 11C, a second work function material 1108* is deposited on exposed surfaces of the structure illustrated in FIG. 11B. In some embodiments, second work function material 1108* can be different from first work function material 1102*. For example, first work function material 1102* can be formed of tantalum nitride and second work function material 1108* can be formed of titanium nitride. In some embodiments, first and second work function materials 1102* and 1108* can be formed of the same material. In some embodiments, thickness of second work function material 1108* can be between about 10 Å and about 20 Å. For example, second work function material 1108* can have a thickness of about 15 Å. A greater thickness of second work function material 1108* provides sufficient change in the threshold voltage of the semiconductor device but also leaves a smaller deposition window for any subsequently formed layers. As shown in FIG. 11C, second work function material 1108* can be substantially conformally deposited in regions 930A-930D. For example, second work function material 1108* can be deposited using a substantially conformal deposition method, such as ALD or CVD. In some embodiments, second work function material 1108* can be deposited at a temperature between about 400° C. and about 450° C. For example, a deposition temperature can be between about 400° C. and about 420° C., between about 420° C. and about 435° C., between about 435° C. and about 450° C., or any other suitable temperatures. In some embodiments, second work function material 1108* can be deposited using titanium chloride and ammonia as precursors for depositing conformal titanium nitride material. In some embodiments, the deposition chamber pressure can be between about 2 Torr and about 10 Torr. For example, the deposition chamber pressure can be between about 2 Torr and about 5 Torr, between about 5 Torr and about 10 Torr, or any other suitable chamber pressure.

Blocking layer 1109 can be formed on second work function material 1108* in region 930B. In some embodiments, the formation and composition of blocking layer 1109 can be similar to blocking layer 1106 described above in FIG. 11A and are not described in detail here for simplicity. For example, blocking layer 1109 can be of photoresist material and formed using a patterning and etching process.

Figure 11D:
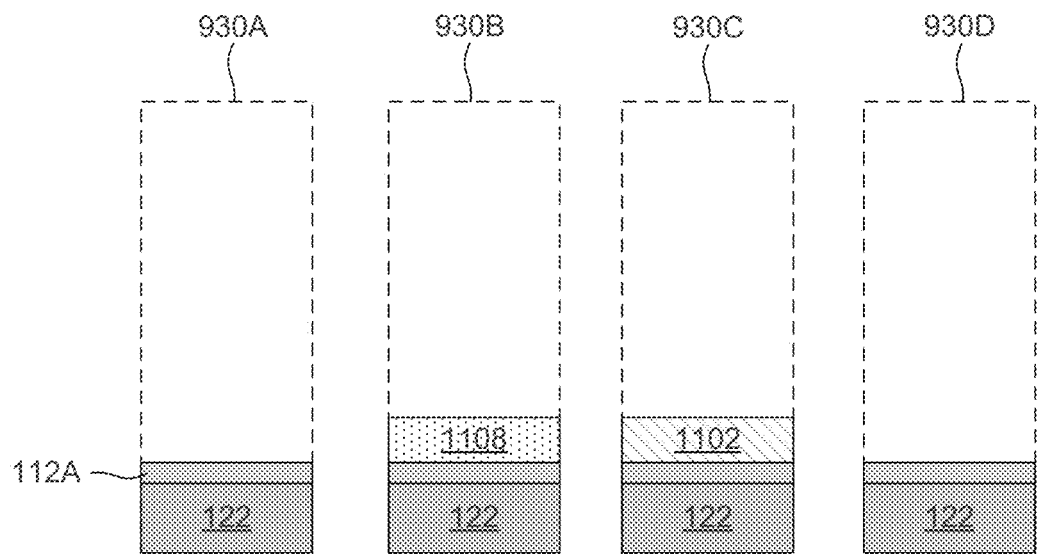

Referring to FIG. 10, at operation 1008, an etching process is performed to remove portions of the second work function material to form a second work function layer in a second device region, according to some embodiments. Referring to FIG. 11D, portions of second work function material 1108* can be removed from regions 930A, 930C, and 930D, and the remaining second work function material 1108* forms second work function layer 1108 in region 930B. Blocking layer 1110 can be used to protect the underlying second work function material 1108* while suitable etching processes remove exposed second work function material 1108* from regions 930A, 930C, and 930D. In some embodiments, the etching processes to etch away portions of second work function material 1108* can be a wet chemical etching process. For example, second work function material 1108* formed using titanium nitride can be etched away using chemical solutions, such as ammonium hydroxide, hydrogen peroxide, any suitable etching solutions, and/or combinations thereof. In some embodiments, dry etching processes can be used to remove portions of second work function material 1108*. The etching processes can continue until underlying gate dielectric layer is exposed in regions 930A and 930D, and first work function layer 1102 in region 930C. The remaining second work function material 1108* forms second work function layer 1108 in a second device region such as region 930B.

Figure 11E:
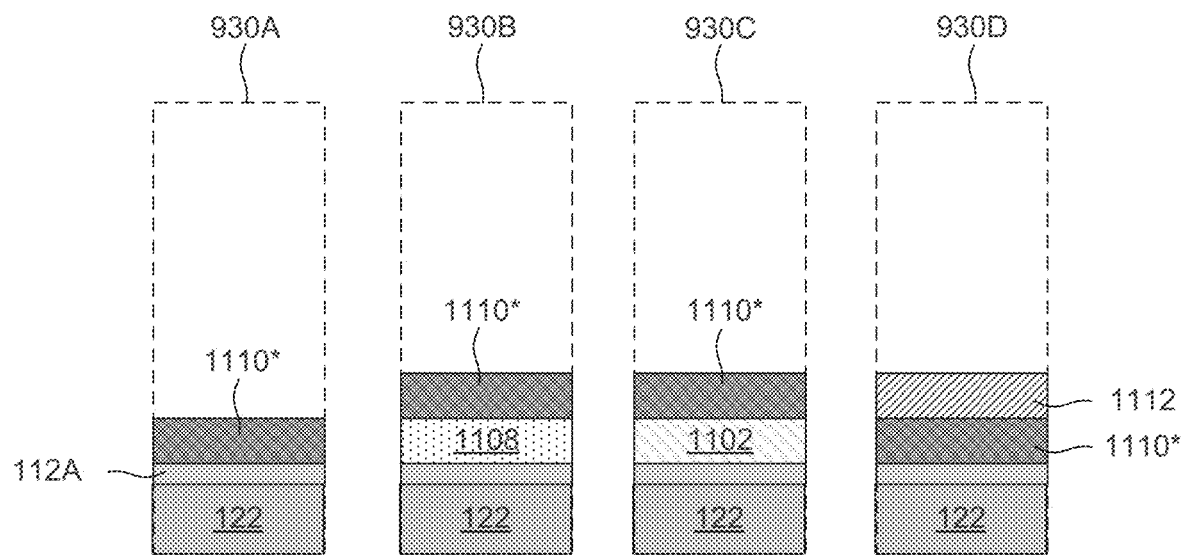

Referring to FIG. 10, at operation 1010, a third work function material is deposited on the gate dielectric layer and the first and second work function layers, according to some embodiments. Referring to FIG. 11E, third work function material 1110* is deposited on exposed surfaces of the semiconductor structure illustrated in FIG. 11D. For example, third work function material 1110* is blanket deposited on gate dielectric layer 112A, on first and second work function layers 1102 and 1108, and on other exposed surfaces of the semiconductor structure. In some embodiments, thickness of third work function material 1110* can be between about 10 Å and about 20 Å. For example, third work function material 1110* can have a thickness of about 15 Å. A greater thickness of third work function material 1110* provides sufficient change in the threshold voltage of the semiconductor device but also leaves a smaller deposition window for subsequently formed layers. Third work function material 1110* can be formed of a work function metal the same or different from first or second work function material 1102* or 1108*. For example, third work function material 1110* can be formed using tungsten carbide nitride. In some embodiments, third work function material 1110* can be formed using titanium nitride or tantalum nitride. Third work function material 1110* can be formed using a substantially conformal deposition process, such as ALD or CVD. In some embodiments, a blocking layer 1112 can be formed in region 930D and on a portion of third work function material 1110*. In some embodiments, the formation and composition of blocking layer 1112 can be similar to blocking layer 1106 and 1109 described above in FIGS. 11A and 11C, and are not described in detail here for simplicity. For example, blocking layer 1112 can be of photoresist material and formed using a patterning and etching process. Blocking layer 1112 can be used for protecting underlying third work function material 1110* during subsequent fabrication processes.

Figure 11F:
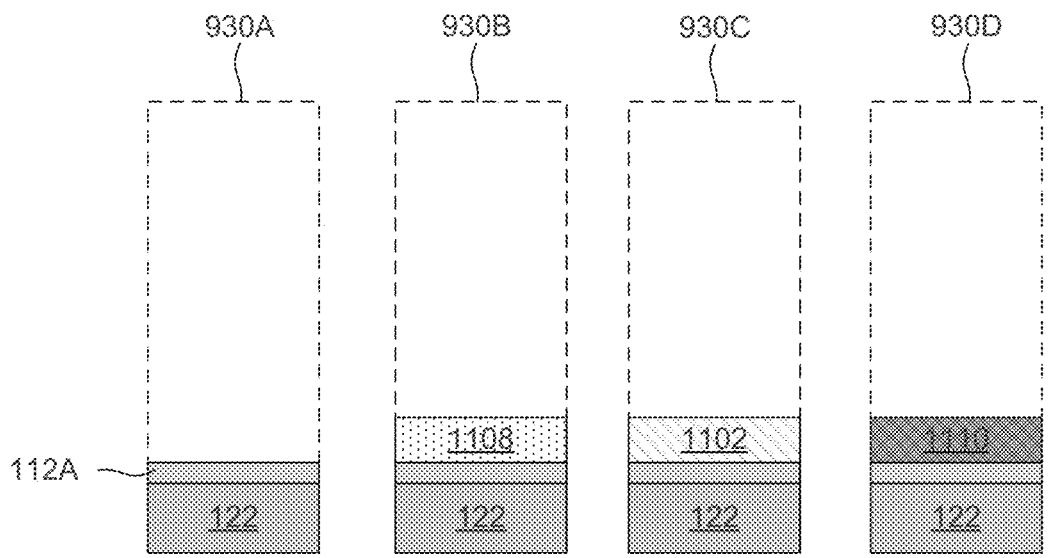

Referring to FIG. 10, at operation 1012, an etching process is performed to remove portions of the third work function material to form a third work function layer in a third device region, according to some embodiments. Referring to FIG. 11F, portions of third work function material 1110* can be removed from regions 930A, 930B, and 930C, and the remaining third work function material 1110* forms third work function layer 1110 in region 930D. Blocking layer 1112 can be used to protect the underlying third work function material 1110* while suitable etching processes remove exposed third work function material 1110* from regions 930A, 930B, and 930C. In some embodiments, the etching processes to etch away portions of third work function material 1110* can be a wet chemical etching process. For example, third work function material 1110* formed using tungsten carbide nitride can be etched away using chemical solutions, such as ozone deionized water solution or any other suitable etching solutions. In some embodiments, dry etching processes can also be used to remove portions of third work function material 1110*. The etching processes can continue until underlying gate dielectric layer is exposed in region 930A, first work function layer 1102 is exposed in region 930C, and second work function layer 1108 exposed in region 930B. The remaining third work function material 1110* forms third work function layer 1110 in third device region such as region 930D.

Figure 11G:
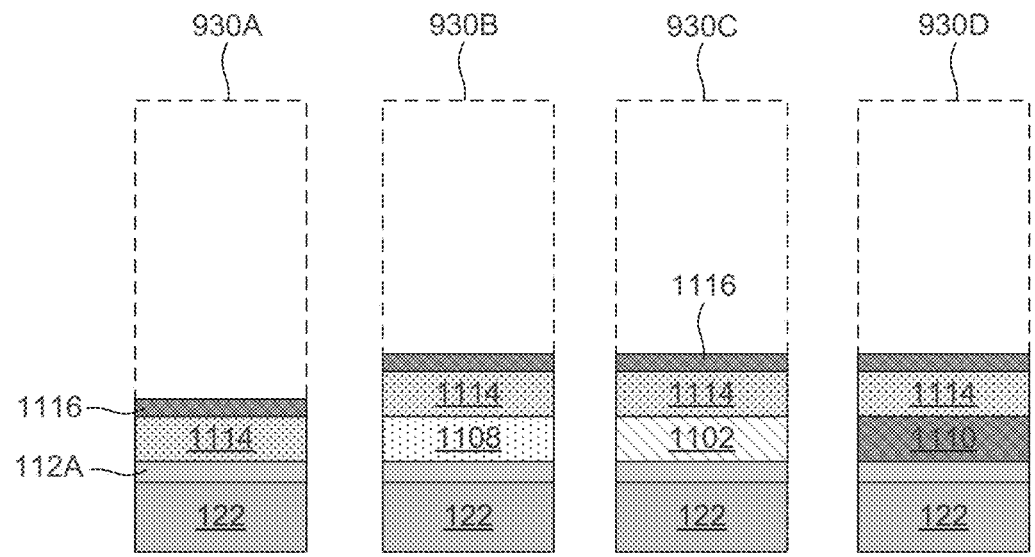

Referring to FIG. 10, at operation 1014, a fourth work function layer is deposited and a silicon capping layer is formed on the gate dielectric layer in a fourth device region, and on the first, second, and third work function layers, according to some embodiments. Referring to FIG. 11G, a fourth work function layer 1114 and a silicon capping layer 1116 are formed on exposed surfaces of the semiconductor structure illustrated in FIG. 11F. Portions of fourth work function layer 1114 and silicon capping layer 1116 can be formed in a fourth device region such as region 930A. In some embodiments, fourth work function layer 1114 can be formed of titanium aluminum carbide. In some embodiments, fourth work function layer can be formed of a material similar or different from first, second, or third work functions layers 1102, 1108, 1110. In some embodiments, thickness of fourth work function layer 1114 can be between about 10 Å and about 20 Å. For example, fourth work function layer 1114 can have a thickness of about 15 Å. A greater thickness of fourth work function layer 1114 provides sufficient change in the threshold voltage of the semiconductor device but also leaves a smaller deposition window for subsequently formed layers which can lead to undesirable voids or defects. As shown in FIG. 11G, fourth work function layer 1114 can be substantially conformally deposited in regions 930A-930D. For example, fourth work function layer 1114 can be deposited using a substantially conformal deposition method, such as ALD or CVD. In some embodiments, fourth work function layer 1114 can be deposited at a temperature between about 300° C. and about 380° C. For example, a deposition temperature can be between about 300° C. and about 340° C., between about 340° C. and about 365° C., between about 365° C. and about 385° C., or any other suitable temperatures. In some embodiments, fourth work function layer 1114 can be deposited using titanium chloride and triethylaluminium as precursors for depositing conformal titanium aluminum carbide material. In some embodiments, the deposition chamber pressure can be between about 2 Torr and about 3 Torr, or any other suitable chamber pressure. For example, the deposition chamber pressure can be about 3 Torr.

A silicon capping layer 1116 can be formed on fourth work function layer 1114 by performing a treatment process on fourth work function layer 1114. In some embodiments, the treatment process can include an in-situ thermal treatment process using titanium chloride and silane as precursors. In some embodiments, silicon capping layer 1116 can be formed of oxidized silicon such as silicon dioxide. Silicon capping layer 1116 can prevent oxidation of underlying fourth work function layer 1114. Silicon capping layer 1116 can be formed by a suitable treatment, such as a titanium chloride and silane treatment. In some embodiments, the treatment process can be performed at a temperature between about 420° C. and about 480° C. For example, a treatment temperature can be between about 420° C. and about 440° C., between about 440° C. and about 460° C., between about 460° C. and about 480° C., or any other suitable temperatures. In some embodiments, the treatment temperature can be about 450° C. to prevent oxidation of fourth work function layer 1114. In some embodiments, silicon capping layer 1116 can have a thickness between about 10 Å and about 13 Å.

Figure 11H:
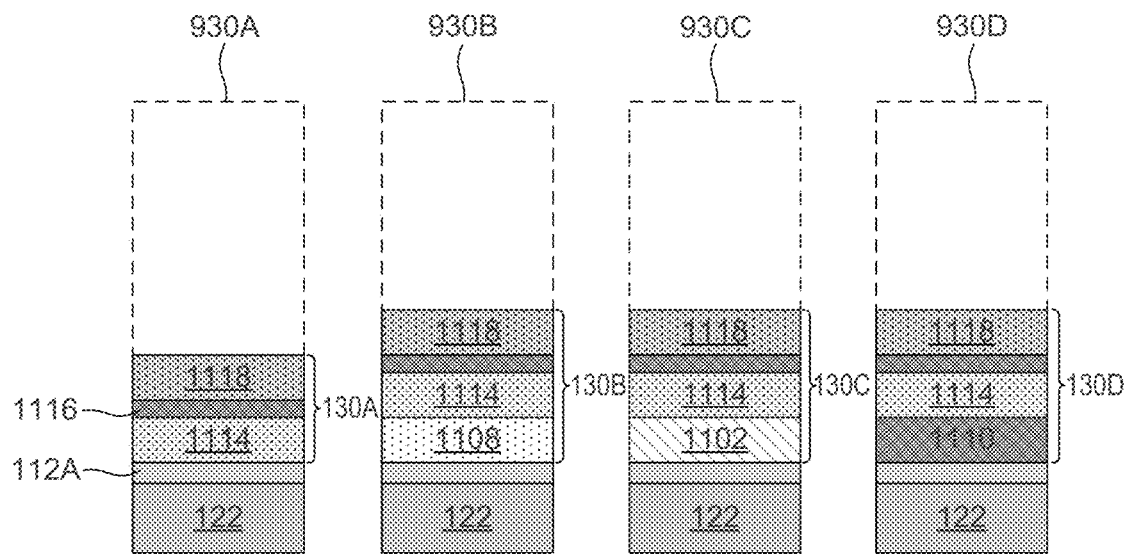

Referring to FIG. 10, at operation 1016, an adhesive layer is deposited, according to some embodiments. Referring to FIG. 11H, an adhesive layer 1118 can be formed on silicon capping layer 1116 in regions 930A-930D. In some embodiments, adhesive layer 1118 can be formed of titanium nitride, titanium, tantalum, tantalum nitride, any suitable adhesive material, and/or combinations thereof. Adhesive layer 1118 can prevent peeling of underlying layers and promote the adhesiveness of subsequently formed gate electrodes. In some embodiments, adhesive layer 1118 can be formed using substantially conformal deposition processes, such as ALD or CVD. In some embodiments, adhesive layer 1118 can also affect finFET threshold voltage and considered as another work function layer. In some embodiments, adhesive layer 1118 can have a thickness between about 10 Å and about 25 Å. For example, adhesive layer 1118 can have a thickness between about 10 Å and about 15 Å, between about 15 Å and about 20 Å, or between about 20 Å and about 25 Å. In some embodiments, adhesive layer 1118 can have a thickness of about 15 Å. A greater thickness of adhesive layer 1118 can more effectively block fluorine diffusion from subsequently deposited gate electrode material, such as tungsten deposited by CVD processes.

As such, exemplary method 1000 forms work function layers 130A-130D respectively in regions 930A-930D that can provide multi-threshold voltage for finFETs 102A-102D. As shown in FIG. 11H, work function layer 130A of NFET 102A can include fourth work function layer 1114, silicon capping layer 1116, and adhesive layer 1118. Work function layer 130B of NFET 102B can include second work function layer 1108, fourth work function layer 1114, silicon capping layer 1116, and adhesive layer 1118. Work function layer 130C of PFET 102C can include first work function layer 1102, fourth work function layer 1114, silicon capping layer 1116, and adhesive layer 1118. Work function layer 130D of PFET 102D can include third work function layer 1110, fourth work function layer 1114, silicon capping layer 1116, and adhesive layer 1118. The variations in work function layer composition across work function layers 130A-130D provides different work function values that in turn lead to different threshold voltages. Although exemplary method 1000 forms work function layers in four GAA devices, it could be applied to forming any suitable number of semiconductor devices, for example, two semiconductor devices, six semiconductor devices, or more.

Figure 11I:
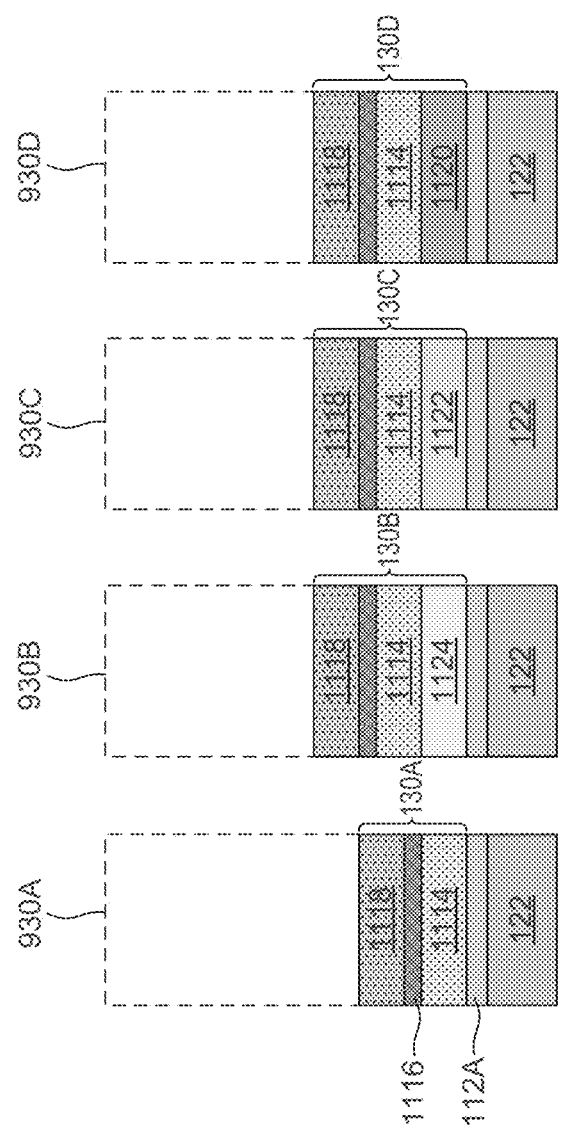

In some embodiments, work function layers 130A-130D can also include work function layers that not only provide multi-threshold voltage devices but also provide as diffusion barrier layers to prevent metal diffusion. For example, silicon incorporated titanium nitride work function layer can prevent aluminum from other work function layers (e.g., titanium aluminum carbide) from diffusing into the underlying gate dielectric. FIG. 11I illustrates work function layers 1120, 1122, and 1124 that can be formed in regions 930B-930D in place of work function layers 1102, 1108, and 1110. Work function layers 1120, 1122, and 1124 not only provide multi-threshold voltages for finFETs 102A-102D but also provide diffusion barrier layers to prevent metal diffusion. Other structures illustrated in FIG. 11I that are similar to FIGS. 11A-11H are labelled with the same annotations for simplicity.

Work function layers 1120, 1122, and 1124 are formed in regions 930D, 930C, and 930B, respectively, and can be formed of silicon incorporated titanium nitride (TiSiN). In some embodiments, other suitable semiconductor material can be used, such as silicon incorporated tantalum nitride (TaSiN). In some embodiments, work function layers 1120, 1122, and 1124 can contain different silicon atomic concentrations to provide multi-threshold voltages across finFETs 102B-102D. As finFET 102A does not include a TiSiN work function layer, it has a threshold voltage different from finFETs 102B-102D. Thicknesses of work function layers 1120, 1122, and 1124 can be between about 10 Å and about 20 Å. For example, thicknesses of work function layers 1120, 1122, and 1124 can be about 15 Å. A greater thickness of work function layers 1120, 1122, and 1124 can provide greater change in the threshold voltage but also leaves a smaller window for subsequent materials to be deposited into the trenches.

Work function layers 1120, 1122, and 1124 can be respectively formed in regions 930B-930D using a deposition, block, and etch fabrication process similar to method 1000 described with respect to FIGS. 10 and 11A-11H. For example, a first work function material used to form work function layer 1120 can be disposed on gate dielectric layer 112A in a blanket fashion in regions 930A-930D. A blocking layer (not illustrated in FIG. 11I) is formed in region 930D and not in regions 930A-930C through a patterning and etching process. The blocking layer can include one or more hard mask layers. For example, the blocking layer can include a bi-layer structure that includes a first hardmask layer on the deposited first work function material and a second hardmask layer formed on the first hardmask layer. The first and second hard mask layers can be formed of different materials to provide better etch selectivity which in turn provides better protection for the underlying first work function material during subsequent etching processes. In some embodiments, the first hard mask layer can be a tantalum nitride layer and the second hard mask layer can be a titanium nitride layer. In some embodiments, the first hard mask layer can have a thickness between about 3 Å and about 8 Å. For example, the thickness of the first hard mask layer can be about 5 Å. In some embodiments, the second hard mask layer can have a thickness similar to the first hard mask layer. For example, the thickness of the second hard mask layer can be about 5 Å. Because the bi-layer structure can have more than one type of material, it can provide a variation in etch selectivity which can provide protection against multiple etchants used in subsequent processes. One or more etching processes can be used to remove the deposited first work function material from regions 930A-930C where the blocking layer having a bi-layer structure is not present and form work function layer 1120 in region 930D. The blocking layer can be removed after work function layer 1120 is formed.

Similarly, work function layers 1122 and 1124 can be formed respectively in regions 930C and 930B through one or more deposit, block, and etch processes. For example, a second work function material used to form work function layer 1122 can be blanket deposited into regions 930A-930D, and a blocking layer can be formed on the deposited second work function material in region 930C where it protects the underlying second work function material while one or more etching processes remove the second work function material from regions 930A, 930B, and 930D to form work function layer 1122. In some embodiments, the blocking layer can be a bi-layer structure that can include a tantalum nitride layer and a titanium nitride layer. Work function layer 1124 can be formed in region 930B using a similar deposit, block, and etch process. For example, a third work function material can be blanket deposited in regions 930A-930D, and a blocking layer can be formed on the deposited third work function material in region 930B where it protects the underlying third work function material while one or more etching processes remove the third work function material from regions 930A, 930C, and 930D to form work function layer 1124.

Work function layers 1120, 1122, and 1124 can be silicon incorporated titanium nitride layers having the same or different silicon atomic concentrations. For example, work function layer 1120 can have a greater silicon atomic concentration than work function layers 1122 or 1124. In some embodiments, work function layer 1120 can have a silicon atomic concentration between about 35% and about 50%. In some embodiments, work function layer 1122 can have a silicon atomic concentration between about 20% and about 35%. In some embodiments, work function layer 1124 can have a silicon atomic concentration between about 5% and about 20%. In some embodiments, work function layer 1120 and 1122 can be used to form a p-type low threshold voltage device 102D and a p-type standard threshold voltage device 102C, respectively. In some embodiments, work function layer 1124 can be used to form an n-type standard threshold voltage device 102B.

In some embodiments, work function layers 1120, 1122, and 1124 can be deposited using suitable deposition processes, such as, ALD, CVD, PVD, sputtering, any suitable deposition methods, and/or combinations thereof. Work function layers 1120, 1122, and 1124 can be deposited using a multi-cycle deposition process, such as an ALD process. The deposition process can include one or more deposition cycles using suitable precursors. For example, the precursors can include titanium tetrachloride, silane, ammonia, any suitable precursors, and/or combinations of the same. In some embodiments, the deposition process can also include suitable pulsing and purging cycles. For example, the deposition process for depositing silicon incorporated titanium nitride can include first and second pulsing/purging cycles. In some embodiments, the first pulsing/purging cycle can include pulsing and purging a first precursor of titanium tetrachloride followed by pulsing and purging a second precursor of ammonia into a deposition chamber for a nominal amount of time to allow chemical reactions for forming titanium nitride. The first pulsing/purging cycle can be followed by a second pulsing/purging cycle. The second pulsing/purging cycle can be used to implant silicon into the titanium nitride formed in the first pulsing/purging cycle. The second pulsing/purging cycle can use suitable precursors such as a first precursor of silane and a second precursor of ammonia. The second pulsing/purging cycle can be repeated more than once to increase the silicon atomic concentration in the titanium nitride layer. A greater number of times of performing the second pulsing/purging cycle can provide greater silicon concentration in the formed silicon incorporated titanium nitride layer. In addition, the first and second pulsing/purging cycles can be performed for a nominal amount of time such that a nominal depth and a nominal silicon atomic concentration can be achieved. Other methods of incorporating silicon into the titanium nitride layer can be used. For example, the flow rate of the first precursor for the second pulsing/purging cycle can be increased to increase the silicon atomic concentration in the formed silicon incorporated titanium nitride layer. In some embodiments, the work function layers can be deposited at a temperature between about 400° C. and about 500° C. In some embodiments, the chamber pressure for depositing work function layers can be between about 2 Torr and about 5 Torr.

In some embodiments, work function layer 1120 can be formed in region 930D using an ALD process that includes one or more deposition cycles. Each deposition cycle can include at least one of the first pulsing/purging cycle and at least one of the second pulsing/purging cycle. For example, in each deposition cycle, the first pulsing/purging cycle can be performed once and the second pulsing/purging cycle can be performed for about three times that provides increased silicon atomic concentration. The deposition cycle can be repeated for a nominal number of times such that a nominal thickness of the work function layer can be reached. For example, the deposition cycle can be performed for about 10 times to about 20 times. In some embodiments, the deposition cycle can be performed for about 15 times. A thickness of work function layer 1120 can be between about 10 Å and about 20 Å. For example, work function layer 1120 can have a thickness of about 15 Å.

In some embodiments, work function layer 1122 can be formed in region 930C using an ALD process that includes one or more deposition cycles. Each deposition cycle can include at least one first pulsing/purging cycle and at least one second pulsing/purging cycle. For example, in each deposition cycle, the first pulsing/purging cycle can be performed once and the second pulsing/purging cycle can be performed for about two times. This can result in a silicon atomic concentration of work function layer 1120 lower than the silicon atomic concentration of work function layer 1120. The deposition cycle can be repeated for a nominal number of times such that a nominal thickness of the work function layer can be reached. For example, the deposition cycle can be performed for about 10 times to about 20 times. In some embodiments, the deposition cycle can be performed for about 15 times. A thickness of work function layer 1122 can be between about 10 Å and about 20 Å. For example, work function layer 1120 can have a thickness of about 15 Å.

In some embodiments, work function layer 1120 can be formed using an ALD process that includes one or more deposition cycles. Each deposition cycle can include at least one first pulsing/purging cycle and at least one second pulsing/purging cycle. For example, in each deposition cycle, the first pulsing/purging cycle can be performed once and the second pulsing/purging cycle can be performed for at least once. This can result in a silicon atomic concentration of work function layer 1124 lower than the silicon atomic concentrations of work function layers 1120 or 1122. The deposition cycle can be repeated for a nominal number of times such that a nominal thickness of the work function layer can be reached. For example, the deposition cycle can be performed for about 10 times to about 20 times. In some embodiments, the deposition cycle can be performed for about 15 times. A thickness of work function layer 1124 can be between about 10 Å and about 20 Å. For example, work function layer 1120 can have a thickness of about 15 Å.

As such, work function layers of silicon incorporated titanium nitride can be formed in regions 930B-930D. Work function layers 1120, 1122, and 1124 can have different silicon atomic concentrations by performing different number of pulsing/purging cycles during the deposition cycle. The different silicon atomic concentrations can provide different threshold voltages for finFETs 102B-102D formed in regions 930B-930D, respectively. FinFET 102A formed in region 930A can also have different threshold voltages from finFETs 102B-102D due to the lack of silicon incorporated titanium nitride work function layer. Similar to the process described with reference to FIGS. 11G-11H, other suitable layers can be formed on work function layers 1120-1124. For example, additional work function layer 1114, capping layer 1116, and adhesive layer 1118 can be formed in regions 930A-930D, and are not described in detail here for simplicity.

Figure 11J:
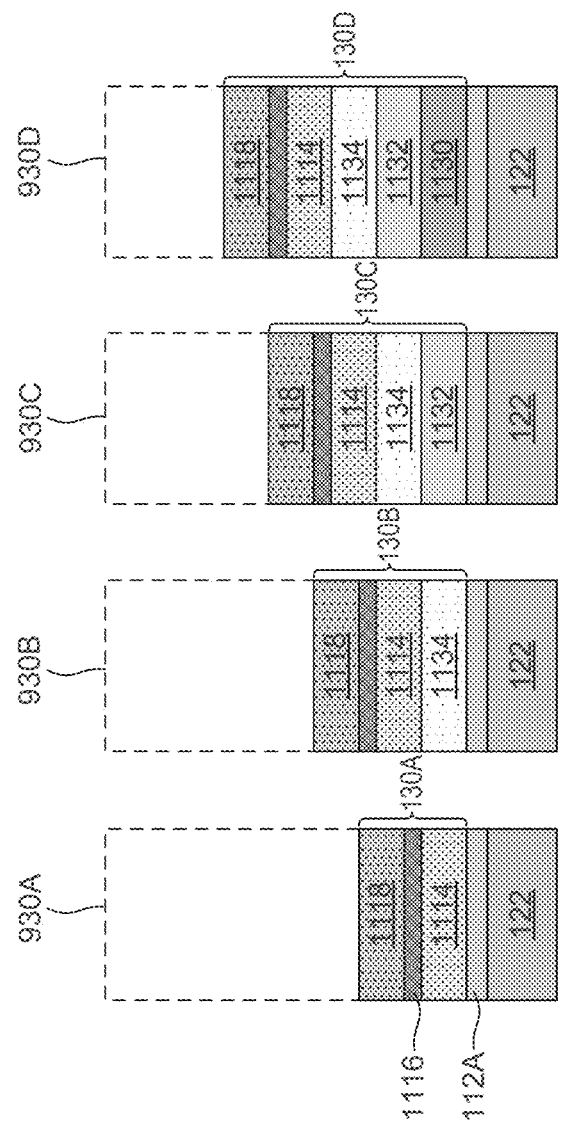

Multi-threshold voltage devices can include nitrogen incorporated work function layers formed by performing one or more thermal annealing treatments on deposited work function material. In some embodiments, the thermal annealing treatment includes a nitrogen anneal process using ammonia. In some embodiments, the nitrogen incorporated work function layers can be formed of titanium aluminum carbon nitride (TiAlCN). In some embodiments, work function layers 130A-130D can include work function layers for multi-threshold voltage devices, and each work function layer can include one or more sublayers. In some embodiments, multiple sublayers of nitrogen incorporated work function layers can be formed in a semiconductor device such as a finFET or a GAA FET. Each sublayer can be formed by depositing a work function material and performing a thermal treatment on the work function material in a nitrogen environment, such as a chamber filled with ammonia. The deposition and treatment processes can be repeated to form another sublayer over the deposited sublayer. The repeated deposition and treatment processes can provide a nitrogen incorporated work function layer with nitrogen uniformly distributed within the work function layer. FIG. 11J illustrates work function layers 1130, 1132, and 1134 that can be formed in regions 930B-930D, respectively. Other structures illustrated in FIG. 11J that are similar to FIGS. 11A-11H are labelled with the same annotations for simplicity.

Work function layers 130B, 130C, and 130D are formed in regions 930B, 930C, and 930D, respectively, and can include one or more layers of nitrogen incorporated titanium aluminum carbide (TiAlCN). In some embodiments, other suitable semiconductor material can be used, such as nitrogen incorporated tantalum aluminum carbide (TaAlCN). In some embodiments, work function layers 130B, 130C, and 130D can contain a different number of sublayers to provide multi-threshold voltages across finFETs 102B-102D. The sublayers of the work function layers can be formed by a process similar to the deposit, block, and etch processes described above in FIGS. 11A-11I. In some embodiments, the sublayers can be treated with a thermal treatment in an ammonia environment to incorporate the deposited work function material with nitrogen. Sublayers can be deposited on top of each other where the ammonia thermal treatment can be performed between the deposition of each sublayer. As such, nitrogen can be distributed substantially uniformly in each sublayer. As finFET 102A does not include a nitrogen incorporated work function layer, it can have a threshold voltage different from finFETs 102B-102D. In some embodiments, work function layer 1130 can have a nitrogen atomic concentration between about 35% and about 50%. In some embodiments, work function layer 1132 can have a nitrogen atomic concentration between about 20% and about 35%. In some embodiments, work function layer 1134 can have a silicon atomic concentration between about 5% and about 20%.

Work function layer 130B for finFET 102B can include at least a nitrogen incorporated work function layer 1134. Devices can also include more than one nitrogen incorporated work function layer to form devices with different threshold voltages. For example, finFET 102C can include nitrogen incorporated work function layers 1132 and 1134. FinFET 102D can include nitrogen incorporated work function layers 1130, 1132, and 1134. Thicknesses of nitrogen incorporated work function layers 1130, 1132, and 1134 can be between about 3 Å and about 8 Å. For example, thicknesses of work function layers 1130, 1132, and 1134 can be about 5 Å. A greater thickness of work function layers 1130, 1132, and 1134 can provide greater change in the threshold voltage but also leaves a smaller window for subsequent materials to be deposited into the trenches.

Work function layers 1130, 1132, and 1134 can be formed by a deposit, block, and etch process similar to those described above in FIGS. 11A-11H. A thermal treatment process in a nitrogen environment can be performed between the deposit and block operations.

Nitrogen incorporated work function layer 1130 can be formed in region 930D by depositing a first work function material on gate dielectric layer 112A in regions 930A-930D in a blanket fashion followed by an in-situ thermal treatment and one or more patterning and etching processes. In some embodiments, work function layer 1130 can be formed of nitrogen incorporated titanium aluminum carbide, and a titanium aluminum carbide layer can be first deposited as the first work function material and treated with a thermal annealing process in a nitrogen environment. In some embodiments, an ALD process can be used to deposit titanium aluminum carbide and uses any suitable precursors such as titanium tetrachloride and triethylaluminium (TEA). A thermal treatment can be performed on the deposited first work function material in a nitrogen environment. In some embodiments, ammonia can be pulsed into the deposition chamber to create a nitrogen environment, and any other suitable nitrogen-containing precursors can be used. In some embodiments, the thermal treatment on the first work function material can be performed at a temperature between about 430° C. and about 470° C. For example, the annealing temperature can be about 450° C. The annealing temperature can be determined by the device thermal budget and a higher temperature can result in a greater atomic concentration of nitrogen in the deposited work function layer.

In some embodiments, additional treatment processes can be performed. For example, an in-situ treatment processes can be performed to prevent the deposited work function material from oxidation. In some embodiments, a treatment process using titanium tetrachloride and silane can be performed on deposited titanium aluminum carbide material to prevent oxidation. The treatment process can be performed between about 430° C. and about 470° C., such as at about 450° C. To remove the treated nitrogen incorporated first work function material from regions 930A-930C, a blocking layer (not illustrated in FIG. 11J) can be formed in region 930D but not in regions 930A-930C through a patterning and etching process. The blocking layer can include one or more hard mask layers. For example, the blocking layer can include a bi-layer structure that includes a first hardmask layer on the deposited first work function material and a second hardmask layer formed on the first hardmask layer. The bi-layer hard mask layer can be similar to hard mask 1104 described above in FIG. 11A. One or more etching processes can be used to remove the deposited first work function material from regions 930A-930C where the blocking layer having a bi-layer structure is not present. The remaining first work function material forms work function layer 1130 in region 930D. The blocking layer can be removed after work function layer 1130 is formed. For example, the blocking layer can be removed by suitable wet chemical etching processes, dry etching processes, other suitable etching processes, and/or combinations thereof.

Nitrogen incorporated work function layer 1132 can be formed in regions 930C and 930D using a similar method as work function layer 1130. In some embodiments, work function layer 1132 can be formed of nitrogen incorporated titanium aluminum carbide, and a titanium aluminum carbide layer can be deposited as the second work function material in regions 930A-930D. A thermal treatment can be performed on the deposited second work function material in a nitrogen environment. In some embodiments, ammonia can be pulsed into the deposition chamber to create a nitrogen environment, and any other suitable nitrogen-containing precursors can be used. In some embodiments, the thermal treatment on the second work function material can be performed at a temperature between about 370° C. and about 430° C. For example, the annealing temperature can be about 400° C. Similar to the fabrication process of work function layer 1130, additional treatment processes can be performed. For example, an in-situ treatment processes can be performed to prevent the deposited work function material from oxidation. The blocking layer can be removed after work function layer 1132 is formed in regions 930C and 930D. For example, the blocking layer can be removed by suitable wet chemical etching processes, dry etching processes, other suitable etching processes, and/or combinations thereof.

Nitrogen incorporated work function layer 1134 can be formed in regions 930B-930C using a similar method as work function layers 1130 and 1132. In some embodiments, work function layer 1134 can be formed of nitrogen incorporated titanium aluminum carbide, and a titanium aluminum carbide layer can be deposited as a third work function material in regions 930A-930D. A thermal treatment can be performed on the deposited third work function material in a nitrogen environment, similar to the thermal treatment on work function layers 1130 and 1132. In some embodiments, the thermal treatment on the third work function material can be performed at a temperature between about 320° C. and about 380° C. For example, the annealing temperature can be about 350° C. Similar to the fabrication process of work function layer 1130, additional treatment processes can be performed. For example, an in-situ treatment process can be performed to prevent the deposited work function material from oxidation. The blocking layer can be removed after work function layer 1134 is formed in regions 930B-930D. For example, the blocking layer can be removed by suitable wet chemical etching processes, dry etching processes, other suitable etching processes, and/or combinations thereof.

As such, work function layers of nitrogen incorporated work titanium aluminum carbide can be formed in regions 930B-930D. Work function layers 130B-130D can include one or more sublayers formed of nitrogen incorporated work function layers. The different number of sublayers can provide different threshold voltages for finFETs 102B-102D formed in regions 930B-930D, respectively. FinFET 102A formed in region 930A can also have different threshold voltages from finFETs 102B-102D due to the lack of nitrogen incorporated work function layer such as titanium aluminum carbide. Similar to the process described with reference to FIGS. 11G-11H, other suitable layers can be formed on work function layers 1130-1134. For example, additional work function layer 1114, capping layer 1116, and adhesive layer 1118 can be formed in regions 930A-930D, and are not described in detail here for simplicity.

Figure 11K:
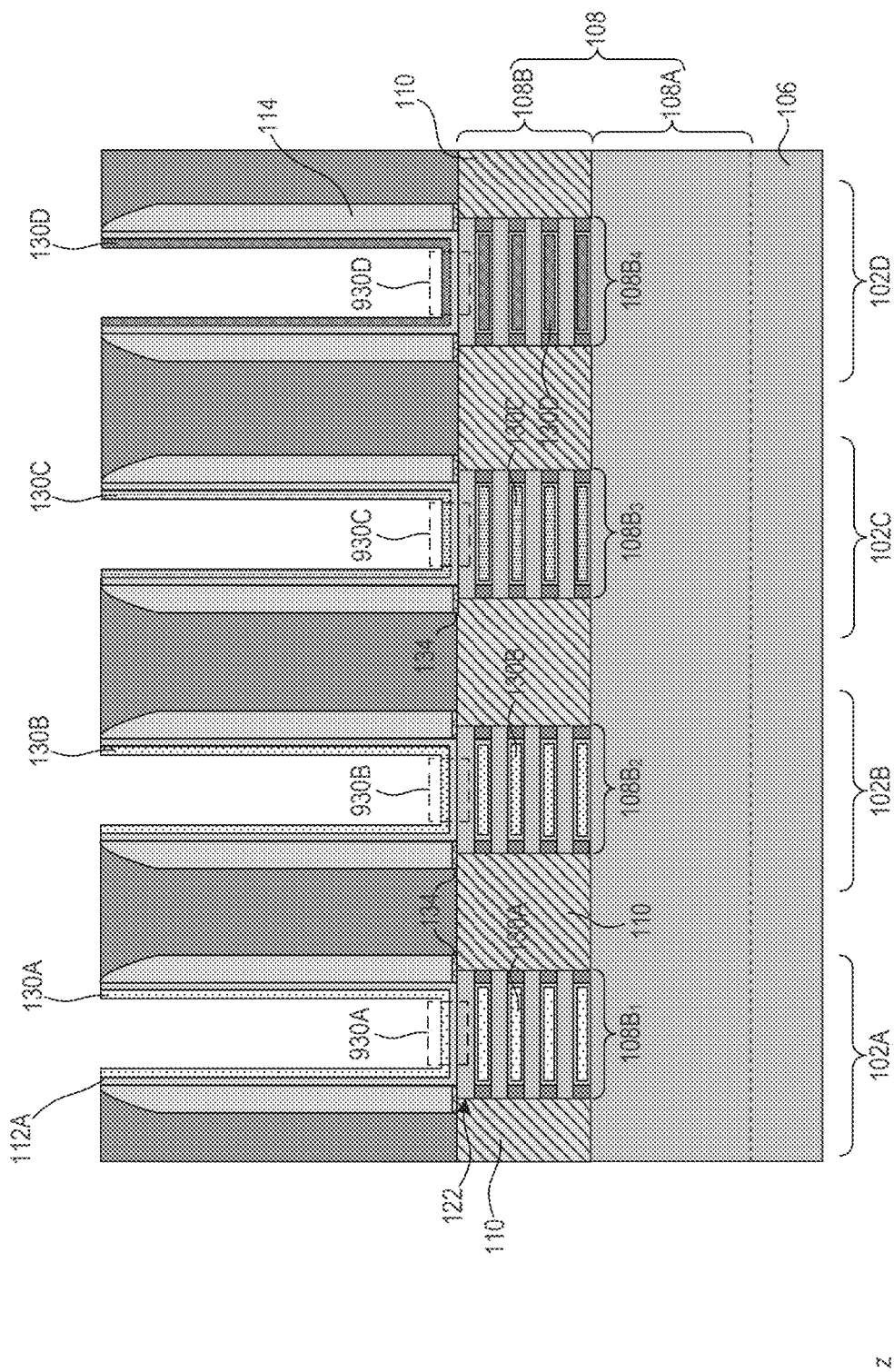

FIG. 11K illustrates work function layers 130A-130D formed on gate dielectric layer 112A that is between spacers 114 and between each layer of the stack of semiconductor layers 122. Gate dielectric layers 112A and gate work function layers 130A-130D can each wrap around nanowire shaped semiconductor layers 122 formed as a result of the removal of first semiconductor layers 320. Depending on the spaces between adjacent semiconductor layers 122, semiconductor layers 122 can be wrapped around by gate dielectric layer 112A and work function layers 130A-130D, filling the spaces between adjacent semiconductor layers 122.

Figures 12A, 12B:
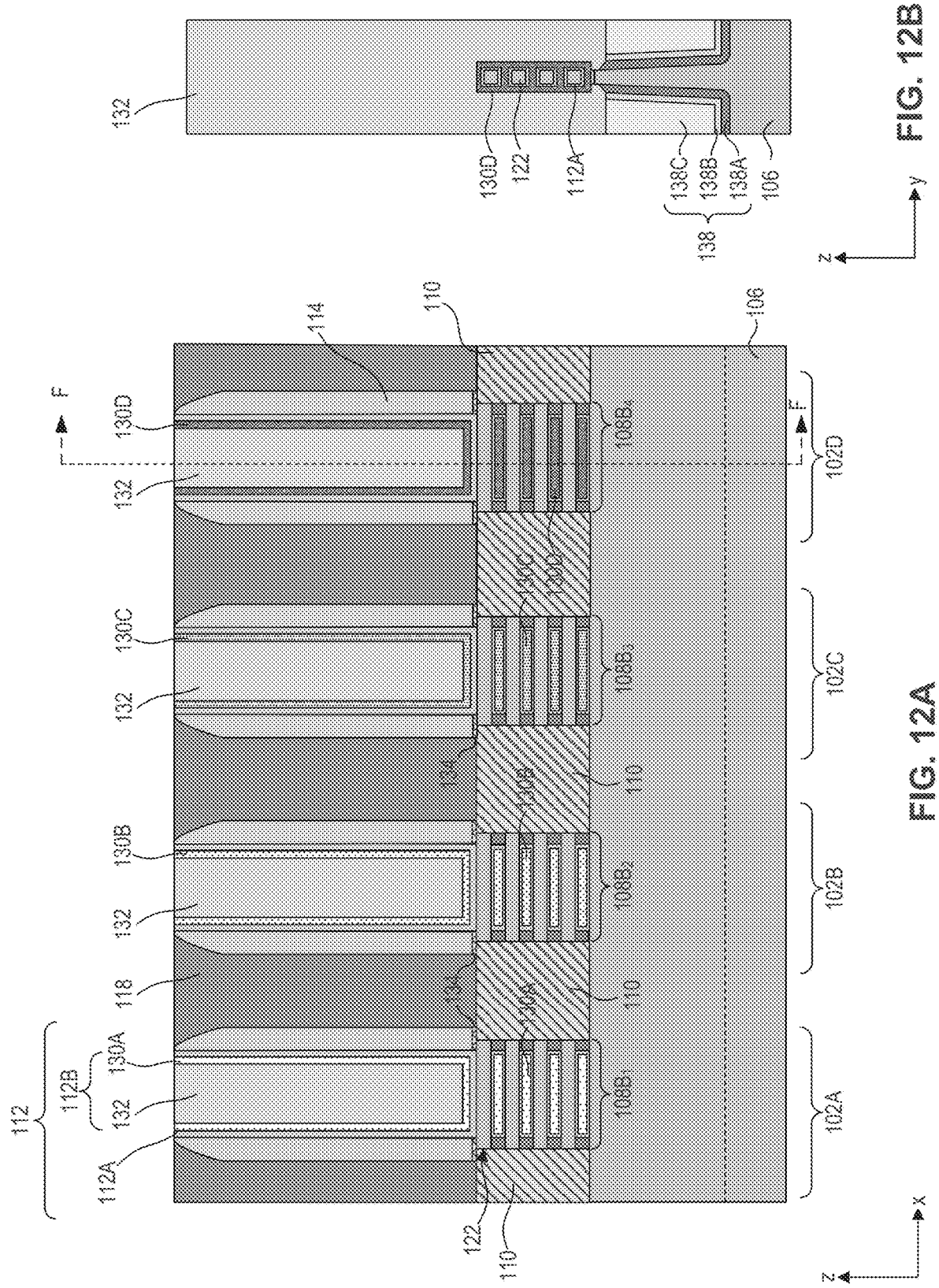
FIGS. 12A-12B are various views of semiconductor devices having multi-threshold voltage devices, in accordance with some embodiments.

Referring to FIG. 2, in operation 245, gate electrodes are formed on the work function layers, according to some embodiments. Referring to FIG. 12A-12B, layers of conductive material for gate metal fill layers 132 are formed on work function layers 130A-130D. The layer of conductive material for gate metal fill layers 132 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and/or combinations thereof. Gate metal fill layers 132 can be formed by ALD, PVD, CVD, or other suitable deposition processes. The deposition of gate metal fill layers 132 can continue until openings between opposing spacers are filled with gate metal fill layers 132. A chemical mechanical polishing process can remove excessive gate metal fill layers 132 such that top surfaces of gate metal fill layers 132 and ILD 118 are substantially coplanar. In some embodiments, other structures can be formed, such as blocking layers, gate contact structures, and S/D contact structures. One or more blocking layers can be formed prior to depositing gate metal fill layers 132 to prevent diffusion and oxidation of gate metal fill layers 132. Gate and S/D contact structures can be formed by forming openings in gate metal fill layers 132 and ILD 118. Gate contact and S/D contact structures can be formed and respectively connected to gate metal fill layers 132 and epitaxial fin region 110. Forming the contact structures can include a deposition of contact metal followed by CMP of the deposited contact metal. The formation of contact metal can include deposition of a metal layer within the openings and silicidation of the deposited metal layer. The conductive materials for the metal layer and/or the contact metal can include titanium, aluminum, silver, tungsten, cobalt, copper, ruthenium, zirconium, nickel, titanium nitride, tungsten nitride, metal alloys, and/or combinations thereof and can be formed by ALD, PVD, CVD, or other suitable deposition processes.

Various embodiments in the present disclosure describe methods for forming multi-threshold voltage devices. A multi-deposition and patterning process can be used in GAA FETs to form multi-layer metal nitride work function materials as n-type work function layers. GAA devices with different threshold voltages can be formed on a same substrate by forming different work function layer compositions through the multi-deposition and patterning process.

In some embodiments, a semiconductor device includes a substrate and a first transistor on the substrate. The first transistor includes a first gate structure and the first gate structure includes a gate dielectric layer and a first work function layer on the gate dielectric layer. The first gate structure also includes a capping layer on the first work function layer. The semiconductor device also includes a second transistor on the substrate and having a second gate structure. The second gate structure includes the gate dielectric layer and a second work function layer on the gate dielectric layer. The second gate structure also includes the first work function layer on the second work function layer and the silicon capping layer on the first work function layer.

In some embodiments, a semiconductor device includes a substrate and a first gate-all-around field effect transistor (GAA FET) on the substrate. The first GAA FET includes a first plurality of nanowires and a gate dielectric layer on the first plurality of nanowires. The first GAA also includes a first work function layer on the gate dielectric layer. The semiconductor device also includes a second GAA FET on the substrate. The second GAA FET also includes a second plurality of nanowires and the gate dielectric layer on the second plurality of nanowires. The second gate structure also includes a second work function layer on the gate dielectric layer and the first work function layer on the second work function layer.

In some embodiments, a method includes depositing a gate dielectric layer on a plurality of nanowires, the plurality of nanowires are formed in first and second device regions. The method also includes depositing a first work function material on the plurality of nanowires in the first and second device regions and removing portions of the first work function material from the second device region to expose the gate dielectric layer, wherein remaining portions of the first work function material form a first work function layer. The method also includes depositing a second work function material in the first and second device regions and removing portions of the second work function material from the first device region to expose the first work function layer, wherein remaining portions of the second work function material forms a second work function layer. The method further includes depositing a third work function layer in the first and second device regions and on the first and second work function layers.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a gate dielectric layer on a plurality of nanowires, the plurality of nanowires formed in first and second device regions;
depositing a first work function material on the plurality of nanowires in the first and second device regions;
removing portions of the first work function material from the second device region to expose the gate dielectric layer, wherein remaining portions of the first work function material form a first work function layer;
depositing a second work function material in the first and second device regions;
removing portions of the second work function material from the first device region to expose the first work function layer, wherein remaining portions of the second work function material form a second work function layer;
depositing a third work function layer in the first and second device regions and on the first and second work function layers; and
performing a treatment process on the third work function layer using titanium chloride and silane as precursors.

2. The method of claim 1, wherein depositing the first work function material comprises depositing tantalum nitride.

3. The method of claim 1, wherein depositing the second work function material comprises depositing titanium nitride.

4. The method of claim 1, wherein depositing the third work function layer comprises depositing titanium aluminum carbide.

5. The method of claim 1, further comprising depositing a capping layer on the third work function layer.

6. A method, comprising:
forming a first gate structure, comprising:
depositing a gate dielectric layer on a substrate;
depositing a first portion of a first work function layer on the gate dielectric layer; and
depositing a first portion of a capping layer on the first portion of the first work function layer;
forming a second gate structure, comprising:
depositing a second work function layer on the gate dielectric layer;
depositing a second portion of the first work function layer on the second work function layer; and
depositing a second portion of the capping layer on the second portion of the first work function layer, wherein depositing the first and second portions of the capping layer comprises depositing silicon dioxide; and
forming a third gate structure, comprising:
depositing a third work function layer on the gate dielectric layer;
depositing a third portion of the first work function layer on the third work function layer; and
depositing a third portion of the capping layer on the third portion of the first work function layer; and
forming a fourth gate structure, comprising:
depositing a fourth work function layer on the gate dielectric layer, wherein depositing the fourth work function layer comprises depositing tungsten carbide nitride;
depositing a fourth portion of the first work function layer on the fourth work function layer; and
depositing a fourth portion of the capping layer on the fourth portion of the first work function layer.

7. The method of claim 6, wherein depositing the first and second portions of the first work function layer comprises depositing titanium aluminum carbide.

8. The method of claim 6, wherein depositing the second work function layer comprises depositing titanium nitride.

9. The method of claim 6, wherein depositing the third work function layer comprises depositing tantalum nitride.

10. The method of claim 6, further comprising depositing an adhesive layer on the first, second, third, and fourth portions of the capping layer.

11. The method of claim 10, wherein depositing the adhesive layer comprises depositing titanium nitride.

12. The method of claim 6, further comprising depositing a gate metal fill layer on the first, second, third, and fourth portions of the capping layer.

13. The method of claim 12, wherein depositing the gate metal fill layer comprises depositing tungsten.

14. A method, comprising:
forming a first n-type gate-all-around field effect transistor (GAA FET) on a substrate, comprising:
forming a first plurality of nanowires;
depositing a first portion of a gate dielectric layer on the first plurality of nanowires; and
depositing a first portion of a first work function layer on the first portion of the gate dielectric layer; and
forming a second n-type GAA FET on the substrate, comprising:
forming a second plurality of nanowires;
depositing a second portion of the gate dielectric layer on the second plurality of nanowires;
depositing a first portion of a second work function layer on the first portion of the gate dielectric layer;
depositing a second portion of the second work function layer on the second portion of the gate dielectric layer;
removing the first portion of the second work function layer; and
depositing a second portion of the first work function layer on the second portion of the second work function layer;
depositing a silicon capping layer on the first and second portions of the first work function layer, wherein the silicon capping layer comprises a silicon oxide material; and
depositing a gate metal fill layer on the silicon capping layer.

15. The method of claim 14, wherein depositing the first and second portions of the first work function layer comprises depositing titanium aluminum carbide.

16. The method of claim 14, wherein depositing the second work function layer comprises depositing titanium nitride.

17. The method of claim 14, further comprising:
forming a first p-type GAA FET on the substrate, comprising:
forming a third plurality of nanowires;
depositing a third portion of the gate dielectric layer on the third plurality of nanowires;
depositing a third work function layer on the gate dielectric layer; and
depositing a third portion of the first work function layer on the third work function layer; and
forming a second p-type GAA FET on the substrate, comprising:
forming a fourth plurality of nanowires;
depositing a fourth portion of the gate dielectric layer on the fourth plurality of nanowires;
depositing a fourth work function layer on the fourth portion of the gate dielectric layer; and
depositing a fourth portion of the first work function layer on the fourth work function layer.

18. The method of claim 5, further comprising depositing an adhesive layer on the capping layer.

19. The method of claim 18, wherein depositing the adhesive layer comprises depositing titanium nitride.

20. The method of claim 14, further comprising depositing an adhesive layer on the silicon capping layer.

* * * * *